United States Patent
Ishimoto

(10) Patent No.: US 10,712,729 B2
(45) Date of Patent: Jul. 14, 2020

(54) SETTING SUPPORT SYSTEM FOR SETTING OPERATIONAL PARAMETER

(71) Applicant: Panasonic Intellectual Property Management Co., Ltd., Osaka (JP)

(72) Inventor: Kenichiro Ishimoto, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 270 days.

(21) Appl. No.: 15/074,019

(22) Filed: Mar. 18, 2016

(65) Prior Publication Data

US 2016/0299495 A1 Oct. 13, 2016

(30) Foreign Application Priority Data

Apr. 9, 2015 (JP) ................................. 2015-079694
Apr. 9, 2015 (JP) ................................. 2015-079696

(51) Int. Cl.
*G05B 19/418* (2006.01)
*G05B 19/4097* (2006.01)
(Continued)

(52) U.S. Cl.
CPC ....... *G05B 19/418* (2013.01); *G05B 19/4097* (2013.01); *H05K 13/046* (2013.01);
(Continued)

(58) Field of Classification Search
CPC ............ G05B 19/41805; G05B 19/418; H05K 13/0417; H05K 13/046
(Continued)

(56) References Cited

U.S. PATENT DOCUMENTS 6,002,650 A 12/1999 Kuribayashi et al.
6,332,536 B2 12/2001 Easton
(Continued)

FOREIGN PATENT DOCUMENTS

CN 102612313 A 7/2012
EP 2480061 A2 7/2012
(Continued)

OTHER PUBLICATIONS

Chinese Search Report dated Jul. 17, 2019 for the related Chinese Patent Application No. 201610216658.5.
(Continued)

*Primary Examiner* — Robert A Cassity
(74) *Attorney, Agent, or Firm* — Pearne & Gordon LLP

(57) ABSTRACT

An operational parameter setting supporting system for setting an operational parameter that specifies an operation of a component mounting apparatus is configured to include in an input unit into which a setting value of a component parameter and a setting value of the operational parameter that corresponds to the component parameter are input, a storage in which a correlation table in which the component parameter and the operational parameter that corresponds to the component parameter are associated with other is stored, and a rule table creation processor that creates a rule table from the setting value of the component parameter and the setting value of the operational parameter that are input into the input unit, and from the correlation table that is stored in the storage.

10 Claims, 15 Drawing Sheets

(51) Int. Cl.
  *H05K 13/08* (2006.01)
  *H05K 13/04* (2006.01)
(52) U.S. Cl.
  CPC ....... *H05K 13/0417* (2013.01); *H05K 13/085* (2018.08); *H05K 13/0882* (2018.08); *G05B 19/41805* (2013.01); *G05B 2219/35012* (2013.01); *G05B 2219/36195* (2013.01); *G05B 2219/45031* (2013.01); *Y02P 90/04* (2015.11); *Y02P 90/265* (2015.11)
(58) Field of Classification Search
  USPC ........................................................ 700/121
  See application file for complete search history.

(56) References Cited

U.S. PATENT DOCUMENTS

| | | | |
|---|---|---|---|
| 6,729,018 B1 | 5/2004 | Takano et al. | |
| 6,971,161 B1 | 12/2005 | Maenishi et al. | |
| 9,936,620 B2 | 4/2018 | Mori et al. | |
| 2001/0002509 A1* | 6/2001 | Suhara | H05K 13/0452 29/834 |
| 2004/0073322 A1* | 4/2004 | Maenishi | H05K 13/0452 700/28 |
| 2004/0080897 A1* | 4/2004 | Kodama | H05K 13/0882 361/234 |
| 2005/0000650 A1 | 1/2005 | Bergstrom et al. | |
| 2005/0036274 A1* | 2/2005 | Suhara | H05K 13/0417 361/600 |
| 2005/0060883 A1 | 3/2005 | Sakai et al. | |
| 2005/0160593 A1* | 7/2005 | Yamamura | H05K 13/0417 29/832 |
| 2006/0229758 A1 | 10/2006 | Maenishi et al. | |
| 2008/0098591 A1 | 5/2008 | Isoda et al. | |
| 2008/0154392 A1 | 6/2008 | Maenishi et al. | |
| 2008/0262642 A1 | 10/2008 | Maenishi et al. | |
| 2014/0290055 A1 | 10/2014 | Kurata | |
| 2015/0034714 A1 | 2/2015 | Koyanagi et al. | |
| 2015/0173205 A1* | 6/2015 | Maenishi | G05B 19/41865 29/832 |
| 2015/0289386 A1* | 10/2015 | Yamazaki | B25J 9/1674 29/739 |
| 2016/0212899 A1 | 7/2016 | Jacobsson et al. | |
| 2018/0312335 A1 | 11/2018 | Jacobsson et al. | |

FOREIGN PATENT DOCUMENTS

| | | |
|---|---|---|
| JP | 3853414 B | 12/2006 |
| JP | 2012-156200 A | 8/2012 |

OTHER PUBLICATIONS

Chinese Search Report dated Jul. 23, 2019 for the related Chinese Patent Application No. 201610217097.0.

* cited by examiner

FIG. 6A

| CORRELATION TABLE 33a | |
|---|---|
| COMPONENT PARAMETER 52 | OPERATIONAL PARAMETER 55 |
| PRICE INFORMATION 53a | THE NUMBER OF TIMES THAT SUCTION OPERATION IS RE-PERFORMED — 57a |
| | THE NUMBER OF TIMES THAT COMPONENT RECOGNITION OPERATION IS RE-PERFORMED — 57b |
| | OPERATION SETTING FOR RE-PERFORMING SUCTION OPERATION — 57c |
| | OPERATION SETTING FOR RE-PERFORMING COMPONENT RECOGNITION OPERATION — 57d |
| | FEEDING OPERATION SETTING OF JOINT PORTION THAT JOINS CARRIER TAPES — 57e |

FIG. 6B

| RULE TABLE 33b | | | | |
|---|---|---|---|---|
| CATEGORY 59 | PATTERN NUMBER 58 | 1  58a | 2  58b | 33c |
| COMPONENT PARAMETER 52 | PRICE INFORMATION 53a | LOW PRICE | HIGH PRICE | |
| OPERATIONAL PARAMETER 55 | THE NUMBER OF TIMES THAT SUCTION OPERATION IS RE-PERFORMED  57a | OUT OF COMPONENT | 1 | |
| | FEEDING OPERATION SETTING OF JOINT PORTION THAT JOINS CARRIER TAPES  57e | FEEDING BY BATCH | NO COUNT | |
| | THE NUMBER OF TIMES THAT COMPONENT RECOGNITION OPERATION IS RE-PERFORMED  57b | 3 | 2 | |
| | | ↑ 33b* | ↑ 33b* | |

FIG. 7

| PATTERN SELECTION 60 61 | | |
|---|---|---|
| FEEDER ADDRESS | SUB-ADDRESS | SELECTION |
| 1 | — | PATTERN 2 |
| 2 | — | PATTERN 2 |
| 3 | L | PATTERN 1 |
| 3 | R | PATTERN 1 |
| 4 | L | PATTERN 1 |
| 4 | R | PATTERN 1 |

61a: rows with feeder addresses 1, 2
61b: rows with feeder addresses 3, 4

FIG. 15A

| CORRELATION TABLE (33a) | |
|---|---|
| COMPONENT PARAMETER (52) | OPERATIONAL PARAMETER (55) |
| PRICE INFORMATION (53a) | THE NUMBER OF TIMES THAT SUCTION OPERATION IS RE-PERFORMED (57a) |
| | THE NUMBER OF TIMES THAT COMPONENT RECOGNITION OPERATION IS RE-PERFORMED (57b) |
| | OPERATION SETTING FOR RE-PERFORMING SUCTION OPERATION (57c) |
| | OPERATION SETTING FOR RE-PERFORMING COMPONENT RECOGNITION OPERATION (57d) |
| | FEEDING OPERATION SETTING OF JOINT PORTION THAT JOINS CARRIER TAPES (57e) |
| COLOR INFORMATION ON CARRIER TAPE (53b) | SUCTION POSITION AUTOMATIC TEACHING USE SETTING (57f) |
| | SUCTION POSITION AUTOMATIC TEACHING PERFORMING TIMING SETTING (57g) |

FIG. 15B

| RULE TABLE (33b) | | | | | |
|---|---|---|---|---|---|
| CATEGORY (59) | PATTERN NUMBER (58) | | 1 | 2 | 3 (33c) |
| COMPONENT PARAMETER (52) | PRICE INFORMATION (53a) | | LOW PRICE | LOW PRICE | HIGH PRICE |
| | COLOR INFORMATION ON CARRIER TAPE | | WHITE, BLACK | TRANSPARENCE | WHITE, BLACK, TRANSPARENCE |
| OPERATIONAL PARAMETER (55) | THE NUMBER OF TIMES THAT SUCTION OPERATION IS RE-PERFORMED | (57a) | OUT OF COMPONENT | OUT OF COMPONENT | 1 |
| | FEEDING OPERATION SETTING OF JOINT PORTION THAT JOINS CARRIER TAPES | (57e) | FEEDING BY BATCH | FEEDING BY BATCH | NO COUNT |
| | THE NUMBER OF TIMES THAT COMPONENT RECOGNITION OPERATION IS RE-PERFORMED | (57b) | 0 | 0 | 0 |
| | SUCTION POSITION AUTOMATIC TEACHING USE SETTING | (57f) | PRESENCE | ABSENCE | ABSENCE |
| | SUCTION POSITION AUTOMATIC TEACHING PERFORMING TIMING SETTING | (57g) | PRESENCE | ABSENCE | ABSENCE |

↑ 33b*  ↑ 33b*  ↑ 33b*

US 10,712,729 B2

SETTING SUPPORT SYSTEM FOR SETTING OPERATIONAL PARAMETER

BACKGROUND OF THE INVENTION

1. Field of the Invention

The present invention relates to a setting support system that is used in a component mounting apparatus which mounts a component on a substrate.

2. Description of the Related Art

In a component mounting apparatus that mounts an electronic component on a substrate, a component supply apparatus repeatedly performs a component mounting process in which, for example, an electronic component that is supplied in state of being held in a carrier tape is transferred by a mounting head including a suction nozzle and is transferred to a substrate for mounting. Because the component mounting process is configured from individual process operations, and the process operations differ depending on a component type that is a process target, processing is performed in such a manner that an operational parameter which stipulates an aspect of performing the individual process operation is set for every process operation and every component type, and that a component library for performing production for every substrate type is created. The process operation suitable for the component type is performed by controlling an operation mechanism of each unit of a component mounting apparatus based on these operational parameters.

In the related art, production data that includes this component library is created for every substrate type based on CAD data or BOM data that is provided from a design department (for example, refer to Japanese Patent No. 3853414). In the technology in the related art that is disclosed in Japanese Patent No. 3853414, mounting data (production data) created based on information such as a dimension or a shape of a mounting target component that is supplied according to a component electronic catalog as the BOM data, and on information such as mounting position data on the mounting target component, which is given as the CAD data, and operation of mounting equipment is controlled based on the created mounting data.

SUMMARY OF THE INVENTION

A setting support system is for setting an operational parameter that stipulates an operation of a component mounting apparatus. The component mounting apparatus is configured to unload an electronic component from a component supply unit including a tape feeder that supplies a carrier tape holding the electronic component and to transfer the electronic component to a substrate for mounting the electronic component to the substrate. The setting support system includes an input unit into which a setting value of a component parameter and a setting value of an operational value are input, a storage configured to store a correlation table, and a creation processor. The component parameter includes at least one of component information relating to the electronic component and tape information relating to the carrier tape. The operational value is related to at least one the operation by the component mounting apparatus. The correlation table links the component parameter to the operational parameter. The creation processor creates a rule table from the setting value of the component parameter and the setting value of the operational parameter which are into to the input unit, and from the correlation table that is stored in the storage.

BRIEF DESCRIPTION OF DRAWINGS

FIGS. 6A and 6B are explanatory diagrams of configurations of a correlation table and a rule table in the component library that is used in the component mounting system according to the exemplary embodiment;

FIG. 7 is an explanatory diagram of pattern selection of the rule table in the component library that is used in the component mounting system according to the exemplary embodiment;

FIGS. 15A and 15B are explanatory diagrams of configurations of a correlation table and a rule table in a component library that is used in the component mounting system according to another exemplary embodiment;

DETAILED DESCRIPTION OF THE PREFERRED EMBODIMENTS

Figure 1:
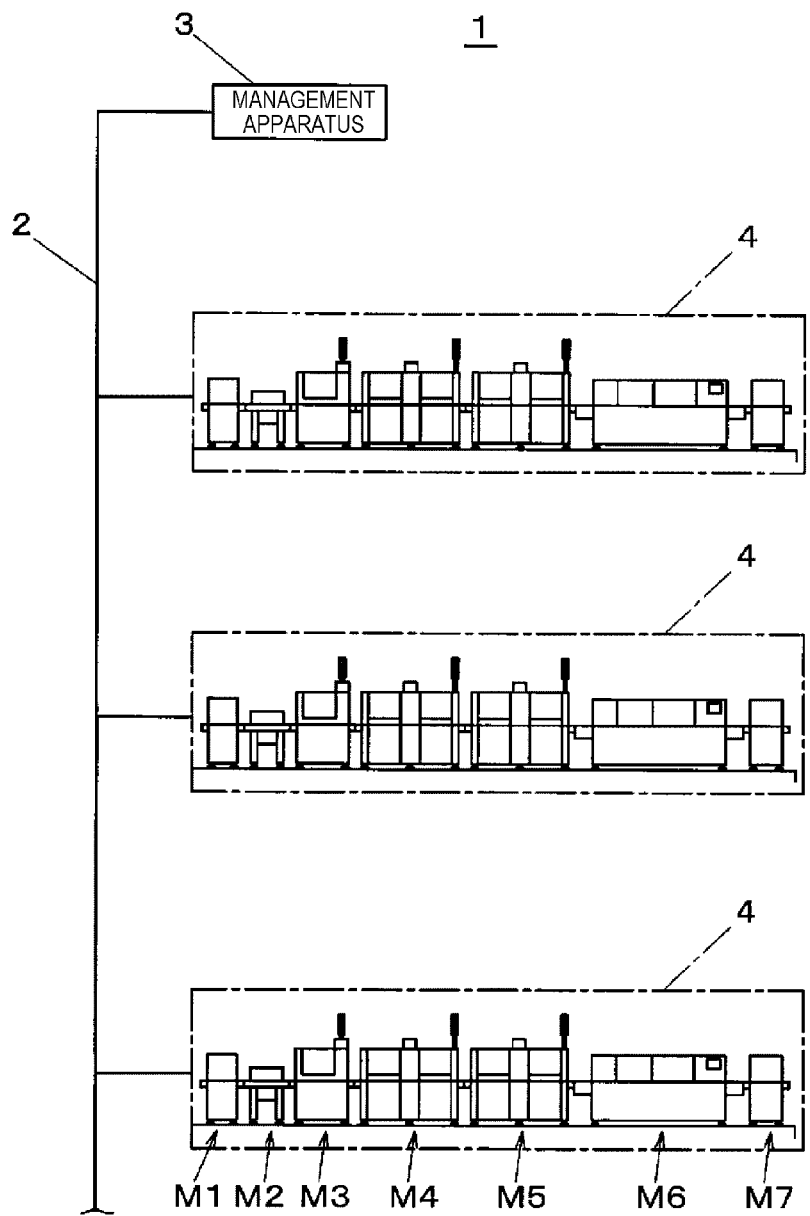
FIG. 1 is an explanatory diagram of a configuration of a component mounting system according to an exemplary embodiment.

In recent years, with advances in miniaturization of electronic apparatuses and refinement of electronic components, more accurate operational control has been required in a component mounting apparatus than that in the related art. Therefore, an operational parameter that constitutes production data and that is stipulated in a component library is also complicated, and there is a need to set many items more finely than in the related art. However, among these operational parameters, there are present operational parameters whose attributes are more difficult to uniquely determine with only CAD data or BOM data that is used for creation of the component library than in the related art. Therefore, an issue is how the operational parameter is handled in the creation or management of the component library, and the problem occurs that a labor or workload is increased for the creation of the data and reliability of the component library that is provided to a production field is reduced.

That is, in the technology in the related art, in a case where there is a need to input a parameter that is not stipulated in the CAD data and the BOM data, the actual circumstance is that the input of the data is left at the discretion of a person who is in charge of data creation and that a default value which is not necessarily suitable or an unsuitable parameter that has a propriety that is not easy to determine is input. After the production data that includes this unsuitable parameter is fed to the production field, an operator performs a cumbersome operation of amending the unsuitable parameter while checking physical components that are actually supplied to the component mounting apparatus. Because of this, an amount of a workload on the operator is large and thus operational improvement is preferable. Furthermore, in most cases, the amendment operation depends on the experience or intuition of the operator. Because of this, it is difficult to avoid an occurrence of inconsistence in amendment details or of an input mistake, which is caused by the operator, and, as a result, the reliability of the component library is reduced.

Exemplary embodiments of the present invention will be described referring to the drawings. First, component mounting system 1 that is a target for application of an operational parameter setting support system to the present exemplary embodiment is described referring to FIG. 1. Component mounting system 1 has a function of mounting an electronic component on substrate 13 and manufacturing a mount substrate. According to the present exemplary embodiment, a configuration is adopted in which multiple component mounting lines 4 are connected to management apparatus 3 through communication network 2. An operation in each of component mounting lines 4 is managed by management apparatus 3. That is, data that is necessary for operating equipment that belongs to component mounting line 4 is transmitted by management apparatus 3 to the equipment, and a result of processing by the equipment is transmitted to management apparatus 3. Functions of management apparatus 3 according to the present exemplary embodiment include a function of setting an operational parameter that is used for performing a component mounting process by component mounting line 4 and of creating the component library.

Component mounting line 4 has a configuration in which substrate supply apparatus M1, substrate delivery apparatus M2, solder printing apparatus M3, component mounting apparatuses M4 and M5, reflow apparatus M6, and substrate recovery apparatus M7 are connected in series to each other. Substrate 13 (refer to FIG. 2) that is supplied by substrate supply apparatus M1 is carried into solder printing apparatus M3 through substrate delivery apparatus M2, and, at this point, a solder printing operation of screen-printing component bonding solder on substrate 13 is performed.

Post-solder-printing substrate 13 is sequentially delivered to component mounting apparatuses M4 and M5, and, at this point, the component mounting process of mounting an electronic component is performed on post-solder-printing substrate 13. Post-component-mounting substrate 13 is carried into reflow apparatus M6, and, at this point, the component bonding solder is melted and solidified by being heated according to a predetermined heating profile. Accordingly, the mount substrate is completed which results from the electronic components being solder-bonded to substrate 13 and thus the electronic components being mounted on substrate 13, and is recovered into substrate recovery apparatus M7.

Figure 2:
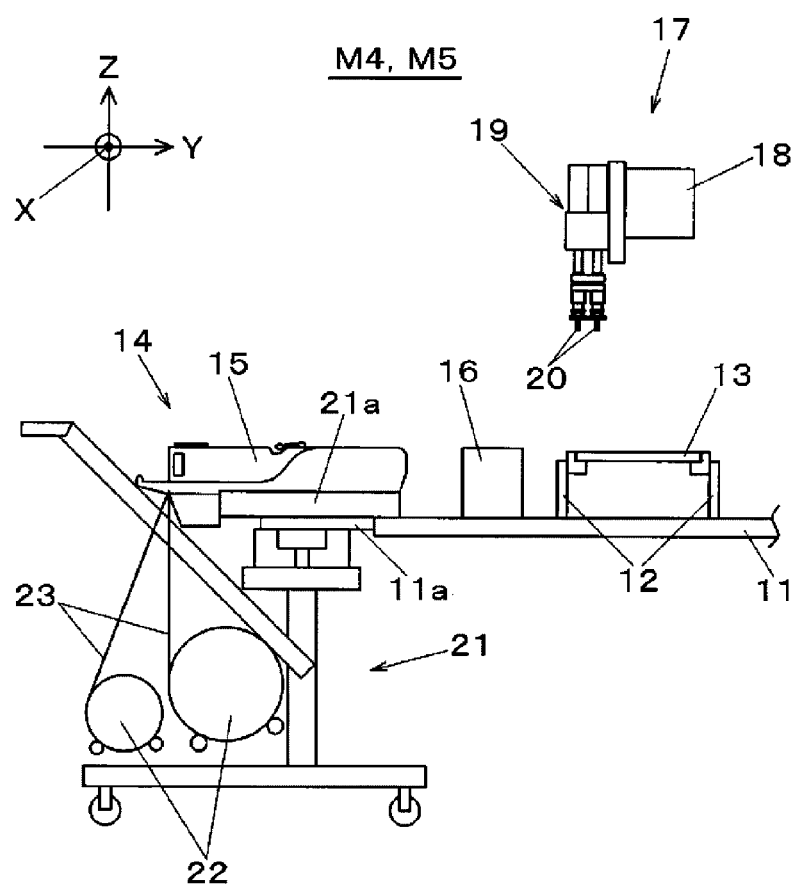
FIG. 2 is a partial cross-sectional diagram of a component mounting apparatus that constitutes the component mounting system according to the exemplary embodiment.
Figure 3:
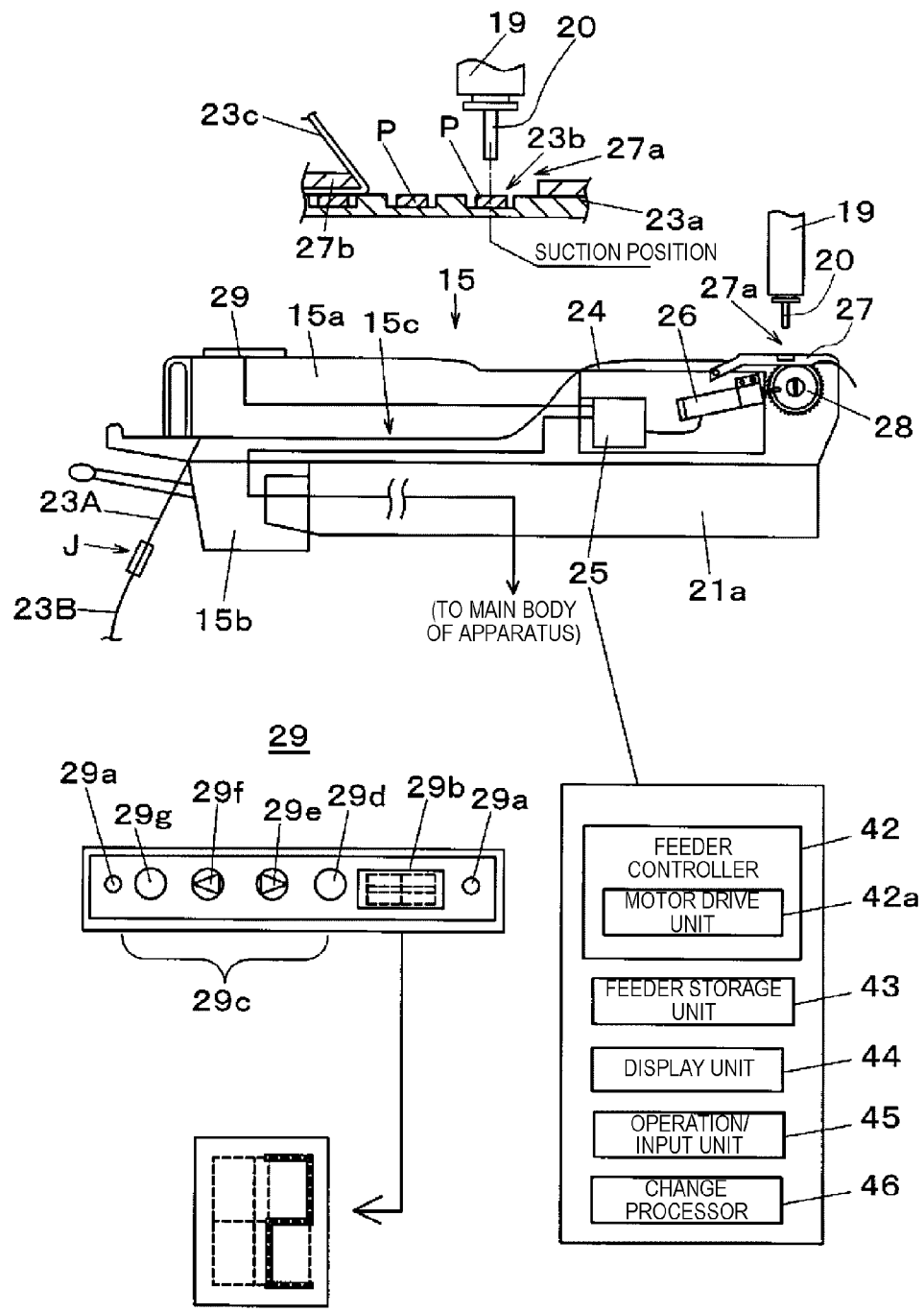
FIG. 3 is an explanatory diagram of a configuration of a tape feeder that is used in the component mounting apparatus according to the exemplary embodiment.

Next, configurations and functions of component mounting apparatuses M4 and M5 are described referring to FIGS. 2 and 3. In FIG. 2 illustrating cross sections of essential portions component mounting apparatuses M4 and M5, substrate transportation mechanism 12 is arranged in a substrate transportation direction (in the X direction, that is, in the direction vertical to the drawing paper) on stage 11. Substrate transportation mechanism 12 transports substrate 13 that is carried into itself from solder printing apparatus M3, and substrate 13 is positioned to be held at a mounting operation position by component mounting mechanism 17. Component mounting mechanism 17 has a configuration in which mounting head 19, on the lower end portion of which suction nozzle 20 is mounted is moved by head movement mechanism 18 horizontally in the X direction and in the Y direction, and transfers an electronic component from a tape feeder 15 and transfers the electronic component to substrate 13 for mounting.

Component supply unit 14 is arranged to the side in the Y direction (the direction perpendicular to the X direction), of substrate transportation mechanism 12. Cart 21 in a state where tape feeder 15 is mounted in advance on multiple feeder-mounting slots (of which an illustration is omitted) that are provided in feeder base 21a is set in component supply unit 14. A position of cart 21 in component supply unit 14 is fixed by clamping feeder base 21a to fixed base 11a that is provided to stage 11.

Feeder addresses are attached to each of the feeder mounting slots, respectively. By designating these feeder addresses, tape feeder 15 in component supply unit 14 can be individually specified. Tape reel 22 accommodating carrier tapes 23 each retaining electronic components, in a state where each of carrier tapes 23, is wound, are held in cart 21. Carrier tape 23 that is unwound from tape reel 22 is pitch-fed by tape feeder 15 all the way to a position at which a component is transferred by suction nozzle 20.

Component recognition camera 16 is arranged between component supply unit 14 and substrate 13. Mounting head 19 that transfers the electronic component from tape feeder 15 with suction nozzle 20 is moved to over component recognition camera 16, and thus the electronic component in a state of being sucked to suction nozzle 20 for holding is photographed by component recognition camera 16.

As illustrated in FIG. 3, tape feeder 15 is configured to include feeder main body 15a that constitutes an entire shape of tape feeder 15, and mounting portion 15b that is provided to project downward from a lower surface of feeder main body 15a. In a state where the lower surface of feeder main body 15a is made to run along feeder base 21a and thus tape feeder 15 is mounted, a connector that is provided to mounting portion 15b is fit into feeder base 21a. Accordingly, tape feeder 15 is fixedly mounted on component supply unit 14, and tape feeder 15 is electrically connected to each main body of each of component mounting apparatuses M4 and M5.

Tape traveling track 15c that has an opening in the upstream end portion in a direction in which feeder main body 15a feeds a tape is provided inside of feeder main body 15a, in such a manner as to communicate all the way with a position for suction by mounting head 19. Tape traveling track 15c has a function of guiding the tape-feeding of carrier tape 23 that is unwound from tape reel 22 and is carried into feeder main body 15a from an upstream side of feeder main body 15a to the position for the suction by mounting head 19.

In the tape-feeding of carrier tape 23 by tape feeder 15, a tape splicing operation is performed in which a tail end of carrier tape 23A that is not yet mounted on tape feeder 15 and a head end of new carrier tape 23B that is unwound from new tape reel 22 that is substituted due to component shortage are joined together using bonding tape. Accordingly, a joint portion J that joins together two carrier tapes 23 whenever tape reel 22 is replaced due to the component shortage is formed, and carrier tape 23 is tape-fed continuously by tape feeder 15.

Carrier tape 23 has a configuration in which component pocket 23b that accommodates and holds electronic component P is provided at a predetermined pitch to base tape 23a that constitutes a tape main body. An upper surface of base tape 23a is sealed by cover tape 23c that covers component pocket 23b, in order to prevent electronic component P from falling off from component pocket 23b.

Pitch feeding mechanism 24 for pitch-feeding carrier tape 23 by sprocket 28 that is arranged in a posture in which an axis line is horizontal in a downstream end side in the direction in which feeder main body 15a feeds the tape is built into feeder main body 15a. Pitch feeding mechanism 24 includes tape feeding motor 26 that rotatably drives sprocket 28 and control unit 25 that controls tape feeding motor 26. A configuration and a function of control unit 25 are described combined with a control system of the entire component mounting system 1 in FIG. 4.

Tape feeding motor 26 is driven in a state where feeding pins (an illustration of which is omitted) that are provided on a circumference of sprocket 28 are engaged with feeding holes in carrier tape 23, and thus carrier tape 23 is pitch-fed along tape traveling track 15c. A front side of sprocket 28 is at the suction position at which electronic component P within component pocket 23b is sucked by suction nozzle 20 of mounting head 19 and is taken off. Tape pressing member 27 is arranged on an upper surface side of feeder main body 15a in the vicinity of sprocket 28, and suction opening portion 27a is provided to tape pressing member 27, in a manner that corresponds to the position for the suction by suction nozzle 20. An upstream end of suction opening portion 27a is cover tape separation portion 27b for separating cover tape 23c.

Carrier tape 23 is pitch-fed in a state of being pressed by tape pressing member 27 against tape traveling track 15c. While carrier tape 23 travels under tape pressing member 27, cover tape 23c is caused to go around cover tape separation portion 27b and is taken off upward. Thus, cover tape 23c is separated, toward an upstream side of the suction position, from base tape 23a. Accordingly, electronic component P within component pocket 23b is exposed upward in suction opening portion 27a, and is in a state where the transferring of electronic component P is possible with suction nozzle 20.

Operation unit 29 for performing an operation by the operator and reporting to the operator is arranged on a downstream side (left side in the drawings) upper surface that the operator approaches at the time of the operation, in tape feeder 15. In addition to LED light 29a indicating an operation status, the following display devices and an operation device are arranged on an upper surface of operation unit 29. First, display unit 29b is a simple-type display device on which approximately two characters such as numbers or letters are capable of being displayed, and is configured here as a combination of two display elements that are of seven segment types. Operation unit 29 is connected to control unit 25 within tape feeder 15, and display details are notified to operation unit 29 through control unit 25.

An item that is a predetermined item that is set in advance as an item necessary for monitoring operation of tape feeder 15 or for maintenance, which is capable of being simply displayed using a code, is displayed on display unit 29b. According to the present exemplary embodiment, various parameters associated with the performing of a mounting operation, that is, information relating to a tape feeding operation by tape feeder 15 and a component mounting operation by mounting head 19 of component mounting mechanism 17, which is information for setting an operational parameter for stipulating these operational aspects, are set to be displayed on these display items.

Operation input unit 29c is provided to operation unit 29 along with display unit 29b. In addition to an operation input function of operating tape feeder 15 by performing a manual operation, operation input unit 29c has a function in which a display operation input for displaying the information described above on display unit 29b and for switching information that is displayed is performed, and in which a change operation input for changing setting information that is displayed is performed.

According to the present exemplary embodiment, operation input unit 29c is configured from display switching button 29d, tape feeding button 29e, tape returning button 29f, and cover tap winding button 29g. Display switching button 29d is an operation button for switching the display item such as ON/OFF operation of display unit 29b or the setting information described above that is displayed. That is, a pressing operation is performed on display switching button 29d in a state where display unit 29b is in a non-display state, and thus display unit 29b becomes in a display state. When the pressing operation is thereafter performed on display switching button 29d using a predetermined pattern that is defined in advance, the display item such as the setting information that is displayed on display unit 29b is switched, and, whenever the pressing operation is performed, a next display item is sequentially displayed in accordance with a switching order that is set in advance.

Tape feeding button 29e and tape returning button 29f are operation buttons for feeding the tape by performing the manual operation of the carrier tape 23 in tape feeder 15. That is, carrier tape 23 can be fed forward by operating tape feeding button 29e to which an arrow is attached in a forward direction, and carrier tape 23 can be fed backward by operating tape returning button 29f to which the arrow is attached in a backward direction. Cover tape winding button 29g is a manual operation button for winding cover tape 23c. By operating cover tape winding button 29f, cover tape 23c that is separated from base tape 23a at a tape separation position is introduced into a tape recovery unit by cover tape feeding mechanism 24.

Moreover, tape feeding button 29e and tape returning button 29f are used input buttons for changing numerical value data that constitutes the setting information described above. That is, after the display item is selected by display switching button 29d, by operating tape feeding button 29e and tape returning button 29f, a change operation of adjusting the numerical value data can be performed. A configuration of display unit 29b or operation input unit 29c in operation unit 29 is arbitrary, and it is possible to make a suitable selection according to a type of information to set or desired operability.

That is, component mounting apparatuses M4 and M5 with the configurations described above have a function in which electronic component P is transferred, from component supply unit 14 in which at least tape feeder 15 is arranged, by mounting head 19 including suction nozzle 20, and is transferred to substrate 13 for mounting. In the component mounting operation by component mounting apparatuses M4 and M5, a component supply operation by tape feeder 15 or a component mounting process by component mounting mechanism 17 is performed by controlling the operation mechanisms in accordance with the operational parameters that are set in advance according to a type of component that is a mounting target.

Component mounting system 1 according to the present exemplary embodiment has a function of supporting the setting of the operational parameter using a configuration that will be described below. That is, the operational parameter that is set by management apparatus 3 based on the CAD data and the BOM data that are stored in advance is set to be updated whenever necessary, referring to a component parameter (component information and data information) that is acquired as a result of the operator checking the physical component in component mounting line 4. The operational parameter is prepared for every type in the form of the component library that will be described below.

Figure 5:
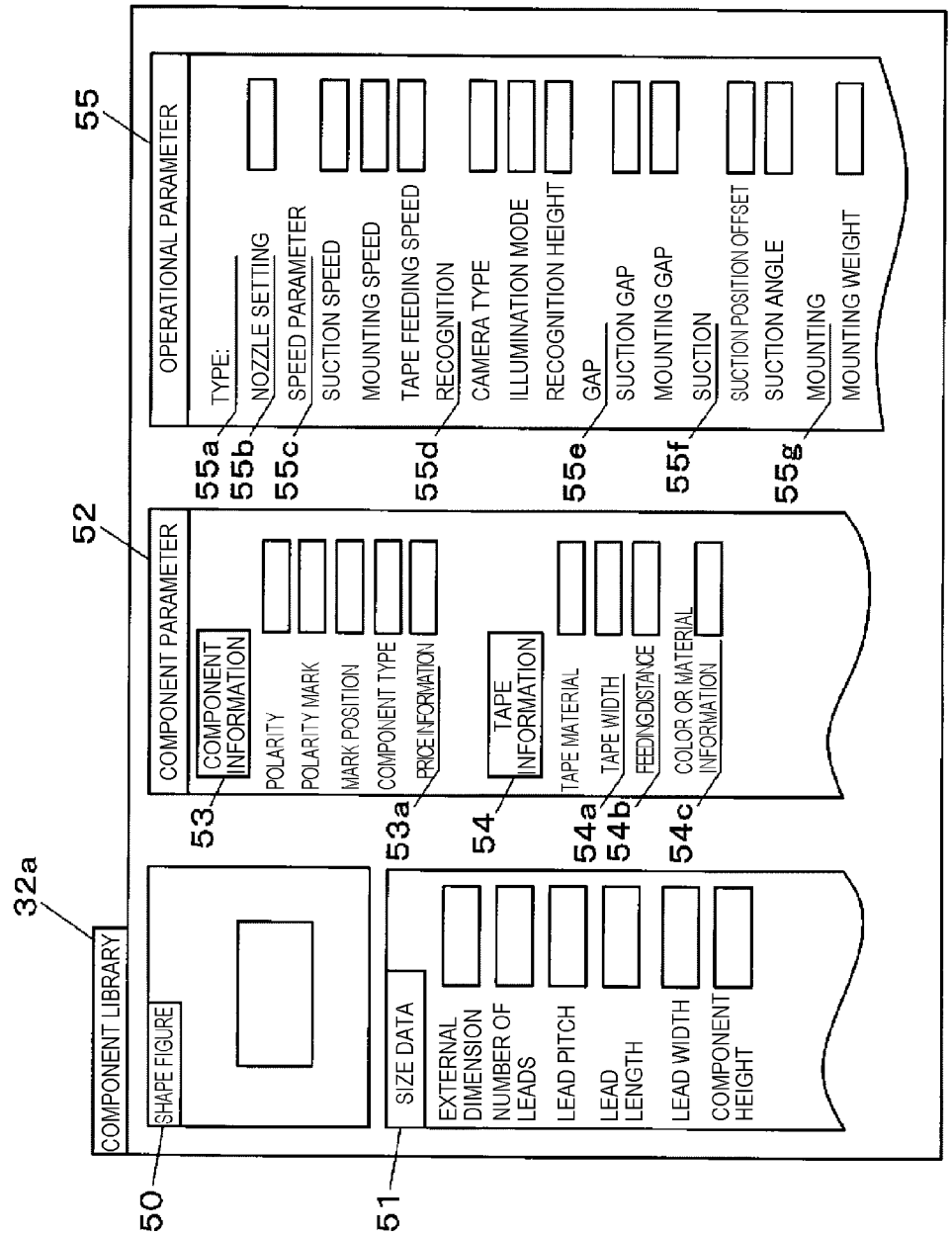
FIG. 5 is an explanatory diagram of a configuration of a component library that is used in the component mounting system according to the exemplary embodiment.

At this point, a configuration example of the component library is described, referring to FIG. 5. In an example that is illustrated in FIG. 5, component library 32a is configured from shape FIG. 50, size data 51, component parameter 52, and operational parameter 55. An image, a numerical value, a term, and the like are displayed on a blank portion of each of the items. The numerical value and the term that are displayed on the blank portion of each of the items are selected for display by the operator from among multiple choices using a tab that is not illustrated. Shape FIG. 50 illustrates an external shape of an electronic component that is a target. Size data 51 are size information on the electronic component, that is, numerical data, such as external dimensions, the number of leads, a lead pitch, a lead length, a lead width, a component height, and the like.

Component parameter 52 is attribute information on the electronic component, and includes component information 53 that is information relating to the component itself, and tape information 54 that is information relating to carrier tape 23 for supplying the electronic component by tape feeder 15. In component information 53, polarity of electronic component P, a polarity mark, a mark position, a component type, and price information 53a are indicated. Tape information 54 includes tape material of carrier tape 23, tape width 54a indicating dimension of carrier tape 23, feeding interval 54b indicating a tape feeding pitch, and color or material information 54c that is information related to characteristics when carrier tape 23 is a target for recognition.

Operational parameter 55 is a machine parameter for stipulating an operational aspect that results when the electronic component is set to be a target for the component mounting process by component mounting apparatuses M4 and M5. An example, illustrated in this point, includes type 55a indicating a type of the mounting apparatus, and nozzle setting 55b indicating a type of suction nozzle 20 that is used. Moreover, operational parameter 55 includes speed parameter 55c, recognition 55d, gap 55e, suction 55f, mounting 55g, and the like.

Speed parameter 55c includes suction a speed that is possible when the electronic component is sucked by suction nozzle 20, a speed that is possible when the electronic component is transferred by mounting head 19, and a speed that is possible when carrier tape 23 is fed tape feeder 15. Recognition 55d is a parameter for stipulating a component recognition mode, and includes a camera type indicating a type of component recognition camera 16 that is used, an illumination mode indicating an illumination type at the time of capturing an image, and a recognition height indicating a height of the electronic component being held by suction nozzle 20 at the time of capturing the image. Gap 55e includes a suction gap that is applied when the electronic component is sucked by suction nozzle 20 and a mounting gap that is applied when the held electronic component is mounted on substrate 13.

Suction 55f stipulates a suction position offset indicating an amount of offset at the time of the suction of the electronic component by suction nozzle 20, or a suction angle. Mounting 55g stipulates a pressing load that is applied when the electronic component that is held in suction nozzle 20 is mounted on substrate 13. Component parameter 52 and operational parameter 55 that are indicated in component library 32a in FIG. 5 are examples of the corresponding items, and in addition to the items that are indicated here, various parameters are set whenever necessary.

In component library 32a described above, a combination that has a specific corresponding relationship is present among combinations of an item for component parameter 52 and an item for operational parameter 55. Many items among the items for operational parameter 55 are uniquely determined by relationships to operations by component mounting apparatuses M4 and M5 when component parameter 52 that is a target is given. However, a case is present where, although, with a combination of a specific item for component parameter 52 and a specific item for operational parameter 55, component parameter 52 that is the target is given, operational parameter 55 cannot be determined necessarily uniquely. This component parameter 52 is determined by any selection rule (or subjective selection by the operator) without having a direct relationship to the operations by component mounting apparatuses M4 and M5. At this point, the operations by component mounting apparatuses M4 and M5 refers to operations that are performed by component mounting apparatuses M4 and M5 in order to manufacture the mount substrate by mounting the electronic component on substrate 13, and, for example, includes a suction operation, a recognition operation, a transportation operation, a mounting operation, and the like.

The item for component parameter 52 that requires the selection rule without having the direct relationship to the operations by component mounting apparatuses M4 and M5 will be described in detail below. The items relating to component parameter 52 and operational parameter 55 that will be described below will be described relating suitably to FIGS. 6A and 6B.

At this point, for an example of a combination of the item for component parameter 52 and the item for operational parameter 55, and each item for operational parameter 55, a setting value of operational parameter 55, which is input into component library 32a, is described. The "setting value" that is used here is not limited to a numerical value setting data that is expressed as a numerical value, and also includes a result of selection of choices that are expressed quantitatively and qualitatively, such as presence/absence, low price/high price, high speed/middle speed/low speed, and the like.

At this point, as component parameter 52, at least one of component information 53 and tape information 54 is a target. For price information 53a in component information 53, information indicating which of low price and high price the electronic component belongs to in light of a price determination reference that is set in advance is a setting value.

As tape information 54, there are tape width 54a, feeding interval 54b, and color or material information 54c. For the tape width, information indicating which of 4 mm, 8 mm, and 12 mm the electronic component belongs to is a setting value. For the color information, information indicating which of white, black, transparency, and the like the electric component belongs to is a setting value. For the material information, information indicating which of paper, emboss, and the like the electric component belongs to is a setting value. The item for component parameter 52 that requires this selection rule is set, and at least one among these items is a target. In addition to these exemplary items, component parameter 52 having the same relationship, that is, a combination of an item for a parameter that has no direct relationship to the operations by component mounting apparatuses M4 and M5 and the item for operational parameter 55 may be present.

Next, as the item for operational parameter 55 that corresponds to price information 53a, there are "the number of times that a suction operation is re-performed" 57a, "the number of times that a component recognition operation is re-performed" 57b, "operation setting for re-performing a suction operation" 57c, "operation setting for re-performing a component recognition operation" 57d, "feeding operation setting of a joint portion that joins carrier tapes" 57e, and the like. At least one among these items is a target.

"The number of times that a suction operation is re-performed" 57a is an item for setting in advance the number of times that the suction operation is re-performed, without stopping the apparatus, immediately when a suction error due to suction nozzle 20 occurs. "The number of times that a component recognition operation is re-performed" 57b is an item for setting in advance the number of times that the recognition operation is re-performed without discarding the component when an component recognition error occurs. As a "setting value that is input", "input the number of times" is stipulated for any one of "the number of times that a suction operation is re-performed" 57a and "the number of times that a component recognition operation is re-performed" 57b.

"Operation setting for re-performing a suction operation" 57c is an item for setting in advance whether or not a re-suction operation is performed without feeding the carrier tape in the event of the suction error. "Operation setting for re-performing a component recognition operation" 57d is an item for setting in advance whether or not a re-recognition operation is performed without discarding the component in the event of the recognition error.

Furthermore, "feeding operation setting of a joint portion that joins carrier tapes" 57e is an item for setting in advance whether the suction operation by suction nozzle 20 is performed on component pocket 23b as a target, in which electronic component P is exposed (setting is present) or the carrier tape is fed by a designated length (setting is absent), after cover tape 23c is separated from carrier tape 23 with cover tape separation portion 27b of suction opening portion 27a, at the time of the tape feeding operation by the joint portion J (refer to FIG. 3).

As a "setting value that is input", for "presence/absence (setting/no setting)" is stipulated for any one of "operation setting for re-performing a suction operation" 57c, "operation setting for re-performing a component recognition operation" 57d, and "feeding operation setting of a joint portion that joins carrier tapes" 57e. Furthermore, as the items for operational parameter 55 that correspond to tape width 54a, feeding interval 54b, and color or material information 54c of tape information 54, "suction position automatic teaching use setting" 57f (refer to FIGS. 15A and 15B), "suction position automatic teaching performing timing setting" 57g, and "carrier tape feeding speed setting" and "carrier tape in-advance feeding setting" are exemplified, and at least one among these items is a target.

"Suction position automatic teaching use setting" 57f is an item for setting in advance whether or not suction position automatic teaching that sets a position of component suction by suction nozzle 20 automatically with image recognition is performed. "Suction position automatic teaching performing timing setting" 57g is an item for setting in advance whether or not the suction position automatic teaching is performed at each timing of running out of work, splicing transferring, and equipment-type switching. As a "setting value that is input", "presence/absence (setting/no setting)" is stipulated for "suction position automatic teaching use setting" 57f, but "presence/absence is input at every timing" is stipulated for "suction position automatic teaching performing timing setting" 57g (refer to FIGS. 15A and 15B).

"Carrier tape feeding speed setting" is an item for setting a feeding speed of carrier tape 23 in tape feeder 15. As a "setting value that is input", "high speed/standard speed/low speed is selected, or a numerical value of a feeding speed is designated" is stipulated. Furthermore, "carrier tape in-advance feeding setting" is an item for setting in advance whether or not component pocket 23b in which electronic component P is exposed by cover tape 23c being separated is fed in advance. As an "a setting value that is input", "presence/absence (setting/no setting)" is stipulated.

In the operational parameter setting support system that is used in component mounting apparatuses M4 and M5 which are used in component mounting system 1 according to the present exemplary embodiment, for the combination of the item for component parameter 52 and the item for operational parameter 55, which has the relationship described above, correlation table 33a, rule table 33b, and pattern data 33c (refer to FIGS. 4, 6A, and 6B) that will be described below are set to be created.

When the component mounting process that uses component library 32a which is prepared in management apparatus 3 is performed, a post-update operational parameter is set to be used that results from changing the existing operational parameter based on a result of checking the physical component in component mounting line 4, rule table 33b, and pattern data 33c. In component library 32a that is used for actual production, component parameter 52 and operational parameter 55 other than the items that are exemplified in correlation table 33a and rule table 33b which are illustrated in FIGS. 6A and 6B are also employed in correlation table 33a and rule table 33b according to characteristics of an individual parameter.

Figure 4:
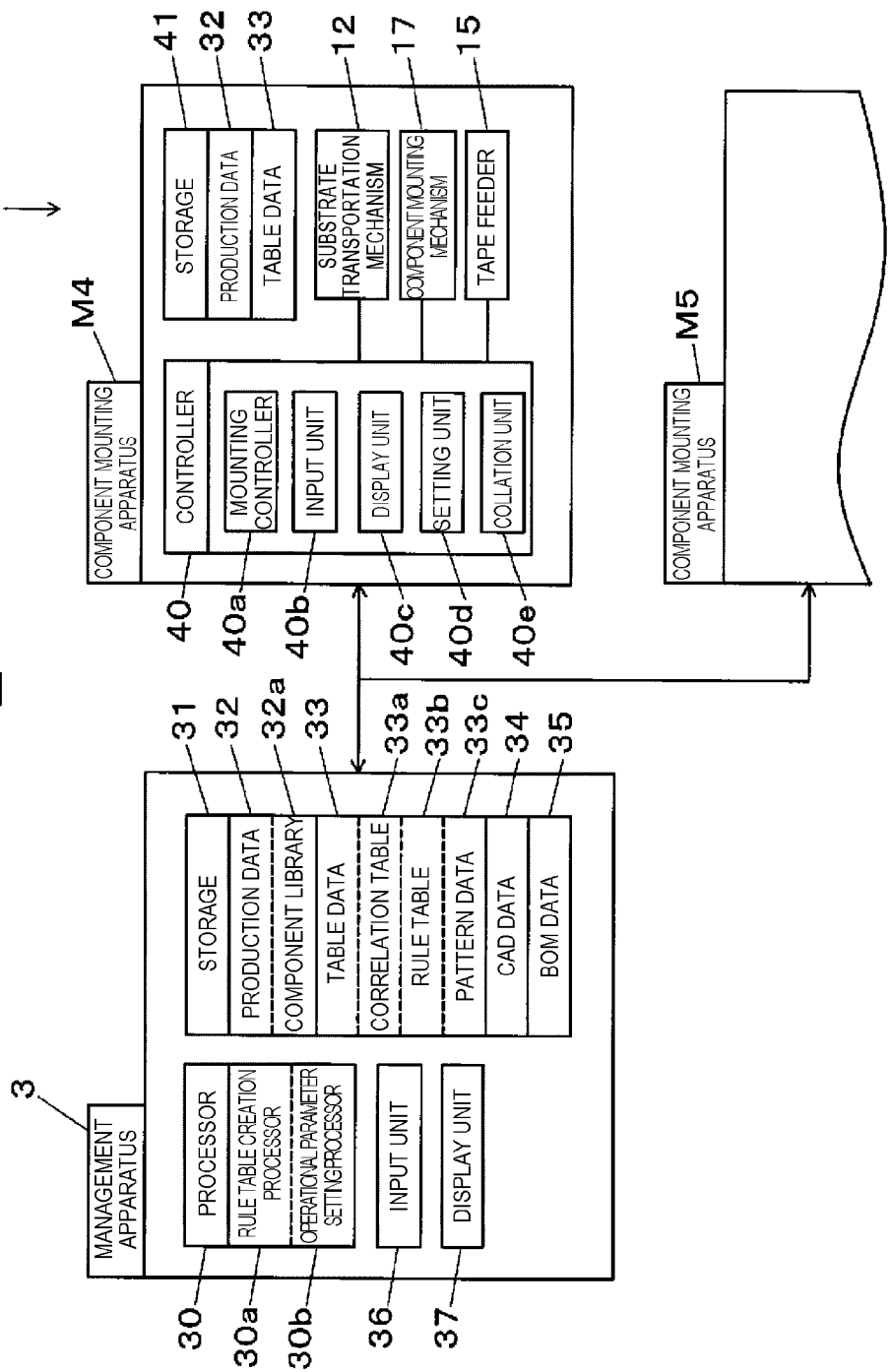
FIG. 4 is a block diagram illustrating a configuration of a control system of the component mounting system according to the exemplary embodiment.

Next, a configuration of a control system of component mounting system 1 that is equipped with this function of supporting the setting of the operational parameter is described referring to FIG. 4. In FIG. 4, among control systems of units of component mounting system 1 with the configuration that is illustrated in FIG. 1, only configurations of management apparatus 3 and component mounting apparatus M4 that is included in one component mounting line 4 are illustrated. Management apparatus 3 is configured to include processor 30, storage 31, input unit 36, and display unit 37. Moreover, processor 30 includes rule table creation processor 30a and operational parameter setting processor 30b.

Input unit 36 performs operation instruction or data input. These data include a setting value of component parameter 52 and a setting value of operational parameter 55. That is, the setting value of component parameter 52 that includes at least one of component information 53 relating to electronic component P and tape information 54 relating to carrier tape 23 that is supplied by tape feeder 15 is input into input unit 36. A screen that provides a guide at the time of the input by input unit 36, a screen for performing processing by rule table creation processor 30a and operational parameter setting processor 30b, or a screen on which a result of performing the processing is displayed is displayed on display unit 37.

Production data 32, table data 33, CAD data 34, and BOM data 35 are stored in storage 31. Production data 32 include component library 32a that is data that are used for performing the production, such as mounting position data that are used for the component mounting process that is performed on substrate 13 that is a production target, which is illustrated in FIG. 5. Correlation table 33a, rule table 33b, and pattern data 33c are included in table data 33. CAD data 34 are substrate design information that is received from a design department. BOM data 35 are component data that are supplied from a supply source of electronic component P.

At this point, correlation table 33a, rule table 33b, and pattern data 33c that are included in table data 33 are described. Correlation table 33a is data that indicate a correlation relationship between component parameter 52 and operational parameter 55 that is linked to component parameter 52, and is created in advance based on user experience or a process performing guideline. In an example that is illustrated in FIG. 6A, a correlation relationship between price information 53a that is component parameter 52, and linked operational parameter 55. At this point, "the number of times that a suction operation is re-performed" 57a, "the number of times that a component recognition operation is re-performed" 57b, "operation setting for re-performing a suction operation" 57c, "operation setting for re-performing a component recognition operation" 57d, and "feeding operation setting of a joint portion that joins carrier tapes" 57e are caused to correspond to price information 53a.

Rule table 33b is table data for stipulating in advance a correspondence relationship to the setting value of operational parameter 55 that corresponds to the setting value of component parameter 52. In an example that is illustrated in FIG. 6B, a setting value of each of "the number of times that a suction operation is re-performed" 57a, "feeding operation setting of a joint portion that joins carrier tapes" 57e, and "the number of times that a component recognition operation is re-performed" 57b, as operational parameter 55, is caused to be linked to two setting values (low price and high price) of price information 53a that is component parameter 52, and is set to be rule table 33b. At this point, a group of setting values of multiple operational parameters 55 that are linked to one setting value of component parameter 52 is defined as one individual rule table 33b*. At this point, pattern number 58 that is listed in a category box 59 is a number for specifying individual rule table 33b*.

In "low price" that is one setting value of price information 53a, "out of stock", "feeding by batch", and an integer value 3 as setting values of operational parameter 55 correspond to "the number of times that a suction operation is re-performed" 57a, "feeding operation setting of a joint portion that joins carrier tapes" 57e, and "the number of times that a component recognition operation is re-performed" 57b, which are operational parameters 55, respectively.

That is, for an electronic component, price information 53a on which is a low price, a setting value is determined as follows. First, as a setting value for "the number of times that a suction operation is re-performed" 57a, the same number of times as the number of times that the suction is repeatedly performed which is set in advance for determination of an occurrence of "component is out of stock" is performed is input as a setting value. First, as a setting value for "feeding operation setting of a joint portion that joins carrier tapes" 57e, "feeding by batch" that enables the tape to be fed by a stipulated tape length that is set in advance is input as a setting value. Moreover, as a setting value for "the number of times that a component recognition operation is re-performed" 57b, an integer value 3 which indicates that the recognition operation is re-performed up to three times in the event of the recognition error is input as a setting value. Multiple setting values that are set for the electronic component, above-described price information 53a, on which is a low price, are specified as individual rule table 33b* ("pattern 1" 58a) with pattern number 58 being 1.

In contrast, for an electronic component, price information 53a on which is a high price, a setting value is determined as follows. First, as the setting value, "the number of times that a suction operation is re-performed" 57a, an integer value 1 which means that the number of times that the suction operation is re-performed is limited to one time is input as a setting value. Furthermore, as the setting value for "feeding operation setting of a joint portion that joins carrier tapes" 57e, "no count" which stipulates that a component is sucked necessarily from component pocket 23b in which the electronic component is present without counting as a suction error being performed is input as a setting value. Moreover, as the setting value for "the number of times that a component recognition operation is re-performed" 57b, an integer value 2 which indicates that the recognition operation is re-performed up to two times in the event of the recognition error is input as a setting value. Multiple setting values that are set for the electronic component, price information 53a on which is a high price, are specified as individual rule table 33b* ("pattern 2" 58b) with pattern number 58 being 2.

With a configuration in which individual rule table 33b* that results from grouping the multiple setting values is specified by pattern number 58, pattern data 33c is defined and is one portion of information that constitutes table data 33. That is, according to the present exemplary embodiment, setting values for multiple operational parameters 55 that are specified by one pattern number 58 are defined as individual rule table 33b*. In other words, in component library 32a, multiple individual rule tables 33b* that are specified by pattern number 58 are stored in component library 32a.

Only with a simple operation in which it is determined whether a setting value of price information 53a on the electronic component is "low price" or "high price", and pattern number 58 that corresponds to the setting value is selected (at the point, any one of "pattern 1" and "pattern 2" is selected), the operator who checks the physical electronic component in component mounting line 4 by using rule table 33b that is created in this manner and pattern data 33c that are defined in rule table 33b can set setting values suitable for multiple operational parameters 55.

Figure 8:
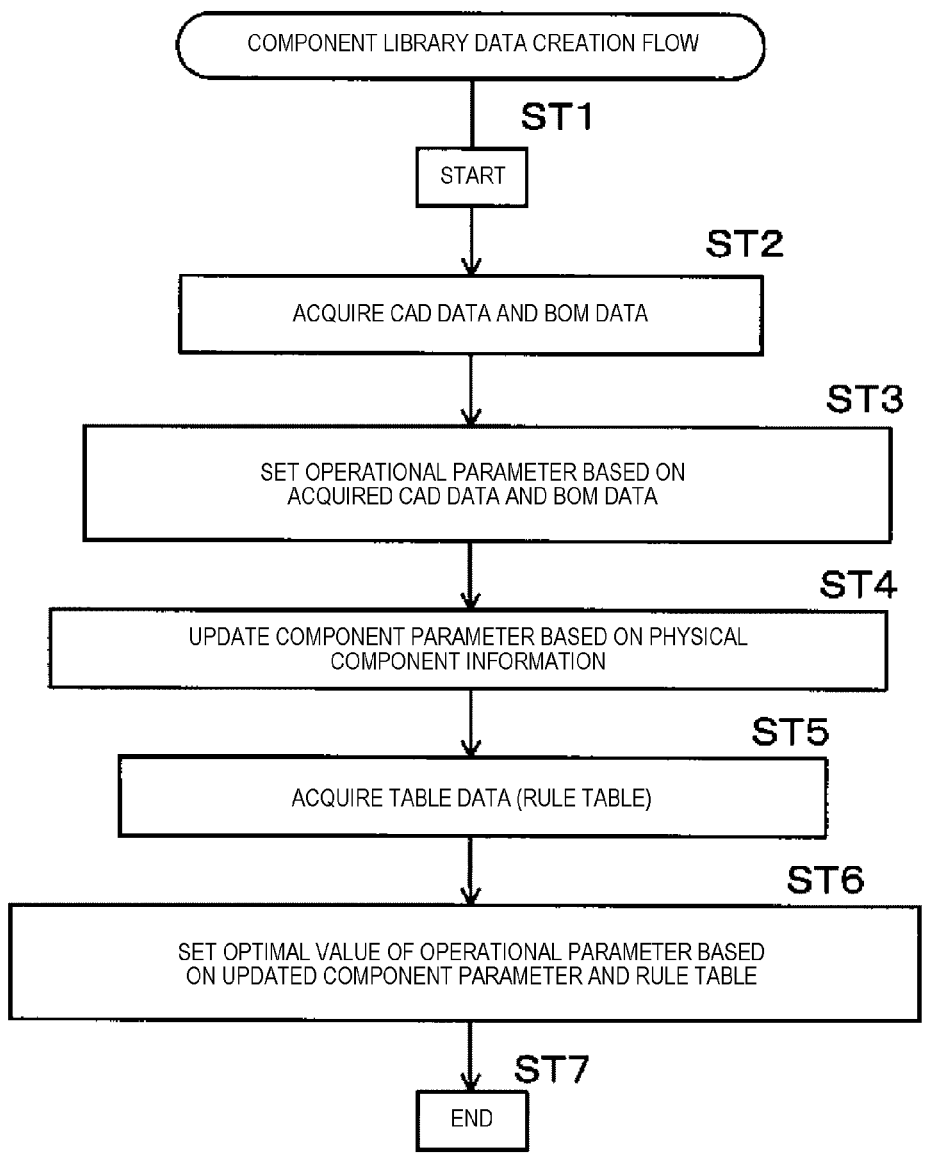
FIG. 8 is a flowchart of component library data creation in the component mounting system according to the exemplary embodiment.

FIG. 7 is an actual example of pattern selection 60 that performs the setting of the operational parameter by the selection of pattern number 58. In FIG. 8, feeder address 61 is an position identification number (1, 2, 3, 4, or so on) that is granted to individually specify multiple tape feeders 15 that are mounted on feeder base 21a (refer to FIG. 3). Sub-address 62 is an auxiliary identification code for identifying two tape feeders 15 (L or R) in a case of a double feeder in which two tape feeders 15 are mounted at one feeder address 61.

In an example that illustrated in FIG. 7, one tape feeder 15 (a single feeder) is mounted at specific address 61a with feeder addresses 61 being 1 and 2, and two tape feeders 15 (a double feeder) are mounted at specific address 61b with feeder addresses 61 being 3 and 4. As illustrated in selection box 63, "pattern 2" 58b is selected at specific address 61a, and "pattern 1" 58a is selected at specific address 61b.

With the configuration described above, correlation table 33a in which component parameter 52 and operational parameter 55 that is linked to component parameter 52 are associated with each other is stored in storage 31. Rule table creation processor 30a that is a function of processor 30 performs processing that creates rule table 33b from the setting value of component parameter 52 and the setting value of operational parameter 55 that are input into input unit 36, and from correlation table 33a that is stored in storage 31. That is, by inputting the setting value of component parameter 52 and the setting value of operational parameter 55 into input unit 36, rule table creation processor 30a reads correlation table 33a that is stored in advance, from storage 31. By applying the setting value of component parameter 52 and the setting value of operational parameter 55 to correlation table 33a, rule table 33b is created and is stored in storage 31.

Furthermore, operational parameter setting processor 30b (a setting unit) performs processing that sets the setting value of operational parameter 55 which is linked to the setting value of component parameter 52 that is input into input unit 36. That is, by inputting the setting value of component parameter 52 into input unit 36, operational parameter setting processor 30b reads stored rule table 33b described above from storage 31. With the setting value of the component parameter 52 that is input and rule table 33b, the setting value of component parameter 52 is derived based on rule table 33b and is displayed on display unit 37.

Next, configurations of control systems of component mounting apparatuses M4 and M5 are described. Component mounting apparatus M4 includes controller 40 and storage 41. Data that has the same details as production data 32 and table data 33 that are stored in storage 31 of management apparatus 3 are stored in storage 41. That is, information that is used for control processing by controller 40, which is component library 32a that is illustrated in FIG. 5, and correlation table 33a, rule table 33b, pattern data 33c, and the like that are illustrated in FIGS. 6A and 6B, is stored in storage 41.

Controller 40 is connected to substrate transportation mechanism 12, component mounting mechanism 17, and tape feeder 15, and includes mounting controller 40a, input unit 40b, display unit 40c, setting unit 40d, and collation unit 40e. Mounting controller 40a controls operations of each of substrate transportation mechanism 12, component mounting mechanism 17, and tape feeder 15, based on production data 32 that is stored in storage 41. Accordingly, the component mounting process that transfers electronic component P, which is transferred from tape feeder 15, to substrate 13 for mounting is performed.

Input into input unit 40b is a setting value of a component parameter that includes at least one of the component information relating to electronic component P and the tape information relating to the carrier tape which is supplied by the tape feeder. Various screens, such as a screen that provides a guide at the time of the input by input unit 40b, a screen for performing processing by setting unit 40d, a screen on which a result of performing the processing, and a screen for pattern selection that is illustrated in FIG. 7, are displayed on display unit 40c. Setting unit 40d sets a setting value of an operational parameter that is linked to a setting value of a component parameter that is input into input unit 40b, based on rule table 33b.

Collation unit 40e has a function of collating the setting value of operational parameter 55 that is input into input unit 40b, and the setting value of operational parameter 55 that is set by setting unit 40d. In a case where the setting value of operational parameter 55 that is input into input unit 40b and the setting value of operational parameter 55 that is set by setting unit 40d are not consistent with each other, collation unit 40e reports an error to display unit 40c (refer to FIG. 12).

In a state where tape feeder 15 is mounted on feeder base 21a, control unit 25 that is included in tape feeder 15 is connected to controllers 40 of component mounting apparatuses M4 and M5. As illustrated in FIG. 3, control unit 25 includes feeder controller 42, feeder storage 43, display unit 44, operation/input unit 45, and change processor 46.

Feeder controller 42 includes motor drive unit 42a for driving tape feeding motor 26, and controls tape feeding operation by tape feeder 15. Feeder storage 43, display unit 44, operation/input unit 45, and change processor 46 are processing functions relating to the supporting of the setting of operational parameter 55, and, because only the operator can have access to tape feeder 15, are set to perform processing relating to the setting of or the changing of operational parameter 55 through operation unit 29.

That is, in a case where component mounting apparatuses M4 and M5 are set to be targets, an input operation is performed on input unit 40b as a target, and in a case where each of tape feeders 15 is set to be a target, the input operation is performed on operation/input unit 45 as a target through operation input unit 29c. Furthermore, in component mounting apparatuses M4 and M5, display details that are displayed on display unit 40c are displayed on display unit 29b of operation unit 29 by display processing by display unit 44.

Stored in feeder storage 43 are rule table 33b in which the setting value of component parameter 52 that includes at least one of component information 53 relating to electronic component P and tape information 54 relating to carrier tape 23, and the setting value of operational parameter 55 relating to an operation by at least one of component mounting apparatuses M4 and M5 are associated with each other, and a pattern (pattern number 58) for specifying multiple setting values that are grouped in a state of being associated in rule table 33b. A pattern (refer to FIG. 6B) of rule table 33b that is stored in feeder storage 43 is displayed on display unit 44. As a form of display, pattern number 58 is set to be displayed on operation unit 29 that is provided to display unit 29b. In FIG. 3, an example is illustrated in which an integer value 2 meaning "pattern 2" 58b is displayed on display unit 29b.

Operation/input unit 45 performs display operation input for displaying the pattern of rule table 33b on display unit 44, and change operation input for changing the pattern of displayed rule table 33b. The input operation is performed using a function of operation input unit 29c that is provided to operation unit 29. Change processor 46 outputs a signal for changing the pattern (pattern number 58) of rule table 33b that is stored in storage 41 of component mounting apparatus M4 and feeder storage 43, based on the change operation input that is input into operation/input unit 45.

The configuration of the control system that is illustrated in FIG. 4 is one example for performing the supporting of the setting of the operational parameter in component mounting system 1, and various variations for accomplishing the same function are possible. For example, in FIG. 4, the creation of rule table 33b or the setting of operational parameter 55 is set to be performed by a processing function of processor 30 (rule table creation processor 30a or operational parameter setting processor 30b) that is included in management apparatus 3, but controllers 40 of component mounting apparatuses M4 and M5 may be made to have these functions. For example, setting unit 40d is set to be equipped with the same functions as those of rule table creation processor 30a and operational parameter setting processor 30b and to be configured to be equipped with the same functions as those of input unit 36 and display unit 37 of management apparatus 3, and input units 40b and display units 40c of component mounting apparatuses M4 and M5.

In the configuration described above, a combination of the input unit 36, storage 31, and rule table creation processor 30a, which has the functions described above, constitutes the operational parameter setting support system for setting operational parameter 55 that stipulates a type of the performing of the mounting processing by component mounting apparatus M4. Moreover, according to the present exemplary embodiment, operational parameter setting processor 30b and display unit 37 are included, and operational parameter setting processor 30b sets the setting value of operational parameter 55 that is linked to component parameter 52, which is input, based on component parameter 52 that is input into input unit 36 and on rule table 33b that is created by rule table creation processor 30a. The setting value of operational parameter 55 is displayed on display unit 37.

Furthermore, a combination of input unit 40b, storage 41, and setting unit 40d that has the function of the creation processor 30a constitutes the operational parameter setting support system for setting operational parameter 55 that stipulates the type of the performing of the mounting operation by component mounting apparatus M4. Moreover, according to the present exemplary embodiment, setting unit 40d and display unit 40c are included, and setting unit 40d sets the setting value of operational parameter 55 that is linked to component parameter 52, which is input, based on component parameter 52 that is input into input unit 40b and on rule table 33b that is created by rule table creation processor 30a. The setting value of operational parameter 55 is displayed on display unit 40c.

Moreover, in a case where a line controller (an illustration of which is omitted) that manages the line is provided to each of multiple component mounting lines 4 in component mounting system 1, a control device of a line managing unit may be made to have the same function as that of controller 40 of component mounting apparatus M4. Accordingly, an operation relating to the supporting of the setting of the operational parameter can be performed for every component mounting line 4 without having access to management apparatus 3 and component mounting apparatuses M4 and M5.

Component mounting apparatuses M4 and M5 and the operational parameter setting support system according to the present exemplary embodiment are configured as described above. Various processing operations that are performed according to the present exemplary embodiment will be described below referring to the drawings. First, component library data creation, that is, a flow for the setting of the setting value of the operational parameter that stipulates the type of the performing of the mounting operations by component mounting apparatuses M4 and M5 is described referring to FIG. 8.

For the component library data creation that is indicated here, component library 32a is created based on only existing available data in management apparatus 3 that is arranged temporarily in a data creation area, and update of component library 32a is set to be performed by performing a necessary data change, based on a result of checking an actual physical component, while the component mounting operation is performed in component mounting line 4 in a production area.

When the component library data creation starts (ST 1), CAD data 34 and BOM data 35 that are stored in storage 31 are first read and acquired by processor 30 of management apparatus 3 (ST 2). Based on CAD data 34 and BOM data 35 that are acquired, operational parameter 55 is set by a processing function of operational parameter setting processor 30b (ST 3).

Accordingly, component library 32a is temporarily created based on only the existing data that is stored in storage 31. Component library 32a that is created at this stage is not set based on component information 53 that is decided for an individual electronic component, and a default value that is set tentatively in advance is used conveniently for information that is not yet decided. Because of this, at a stage in which the production is actually performed in the production area, the not-yet-decided information is decided based on a result of checking the physical electronic component and a suitable data amendment is made. It is convenient to perform the following processing by controller 40 of component mounting apparatuses M4 and M5 in component mounting line 4, which are arranged in the production area, or by a line management apparatus.

In this data amendment, the physical electronic component that is actually used is first checked based on an item that is not-yet-decided information and of which a default value is tentatively set. Based on the information on the physical component, component parameter 52 is updated (ST 4). That is, a suitable setting value of component parameter 52 is acquired and updated that includes at least one of component information 53 relating to the electronic component and tape information 54 relating to carrier tape 23 that is supplied by tape feeder 15.

In this update processing, rule table 33b that is included in table data 33 which is stored in storage 41 (ST 5). That is, rule table 33b is read in which the setting value of component parameter 52 and the setting value of operational parameter 55 relating to at least one of the operations by component mounting apparatuses M4 and M5 are associated with each other. Based on component parameter 52 and rule table 33b that are updated, an optimal value of operational parameter 55 is set (ST 6).

That is, the setting value of operational parameter 55 that is linked to the setting value of component parameter 52 that is acquired is set based on rule table 33b. At this point, as illustrated in FIG. 7, optimal values of multiple operational parameters 55 that are grouped as individual rule table 33b* in rule table 33b are set by batch by selecting and inputting pattern number 58. Accordingly, the component library data creation processing for setting the setting value of operational parameter 55 ends (ST 7).

Figure 9:
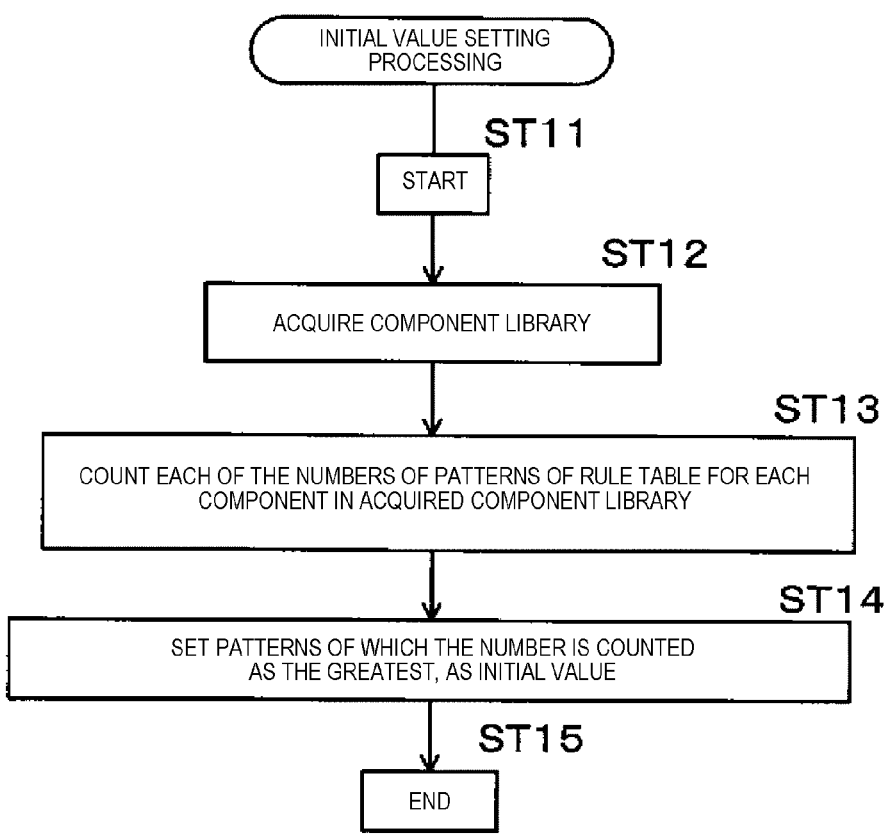
FIG. 9 is a flowchart of initial value setting processing that is performed when the component library data is created in the component mounting system according to the exemplary embodiment.

At this point, processing that sets an initial value that can be possibly used as a default value in the component library data creation processing described above is described referring to FIG. 9. At this point, because a guideline that an initial value is set based on result data at the time of the production is employed, an example is described in which these processing operations are performed by component mounting apparatuses M4 and M5 that are arranged in component mounting line 4. Of course, the processing may be performed using the function of management apparatus 3.

When the initial value setting processing starts (ST 11), component library 32a is first acquired that is stored in storage 41 (ST 12). As is described above, multiple rule tables 33b that are specified by pattern number 28 are stored in component library 32a. Subsequently, for each component in the acquired component library 32a, each of the numbers of patterns of rule table 33b is counted by a function of setting unit 40d (ST 13). The patterns of which the number is counted as the greatest are set as an initial value (ST 14). In other words, setting unit 40d sets a setting value that is lined to "pattern" (a combination of the setting value of component parameter 52 and the value of operational parameter 55) of rule table 33b, which is set most frequently in component library 32a, as an initial value.

Next, a component library data creation flow that uses the initial value which is set using the method described above is described referring to FIG. 10. When the component library data creation starts (ST 21), CAD data 34 and BOM data 35 that are stored in storage 31 are first read and acquired by processor 30 of management apparatus 3 (ST 22). Based on CAD data 34 and BOM data 35 that are acquired, operational parameter 55 is set by the processing function of operational parameter setting processor 30b (ST 23). Accordingly, component library 32a is temporarily created based on only the existing data that is stored in storage 31.

Because the not-yet-decided operational parameter is present in component library 32a at this stage, the initial value as described above is set for the not-yet-decided operational parameter (ST 24). The initial value that is set based on a production result is used in this manner, and thus operational parameter can have higher reliability than in a case where particularly a simple default value is set without being verified.

Subsequently, component parameter 52 is acquired (ST 25). When this component parameter 52 is acquired, data of existing component library 32a may be used instead, and, as in an example in the flow in FIG. 8, the component information may be acquired by checking the physical electronic component. That is, a suitable setting value of component parameter 52 is acquired and updated that includes at least one of component information 53 relating to the electronic component and tape information 54 relating to carrier tape 23 that is supplied by tape feeder 15.

In the update processing, rule table 33b that is included in table data 33 which is stored in storage 41 is acquired (ST 26). That is, rule table 33b is read in which the setting value of component parameter 52 and the setting value of operational parameter 55 relating to at least one of the operations by component mounting apparatuses M4 and M5 are associated with each other. Based on component parameter 52 and rule table 33b that are acquired, it is determined whether or not operational parameter 55 is changed (ST 27).

At this point, in a case where operational parameter 55 is changed, the component library data creation processing for setting the setting value of operational parameter 55 ends (ST 29). In a case where, in ST 27, operational parameter 55 is not changed, as in the example that is illustrated in FIG. 8, the optimal value of operational parameter 55 is set based on component parameter 52 and rule table 33b that are acquired (ST 28), and, thereafter, the component library data creation processing ends (ST 29).

Figure 10:
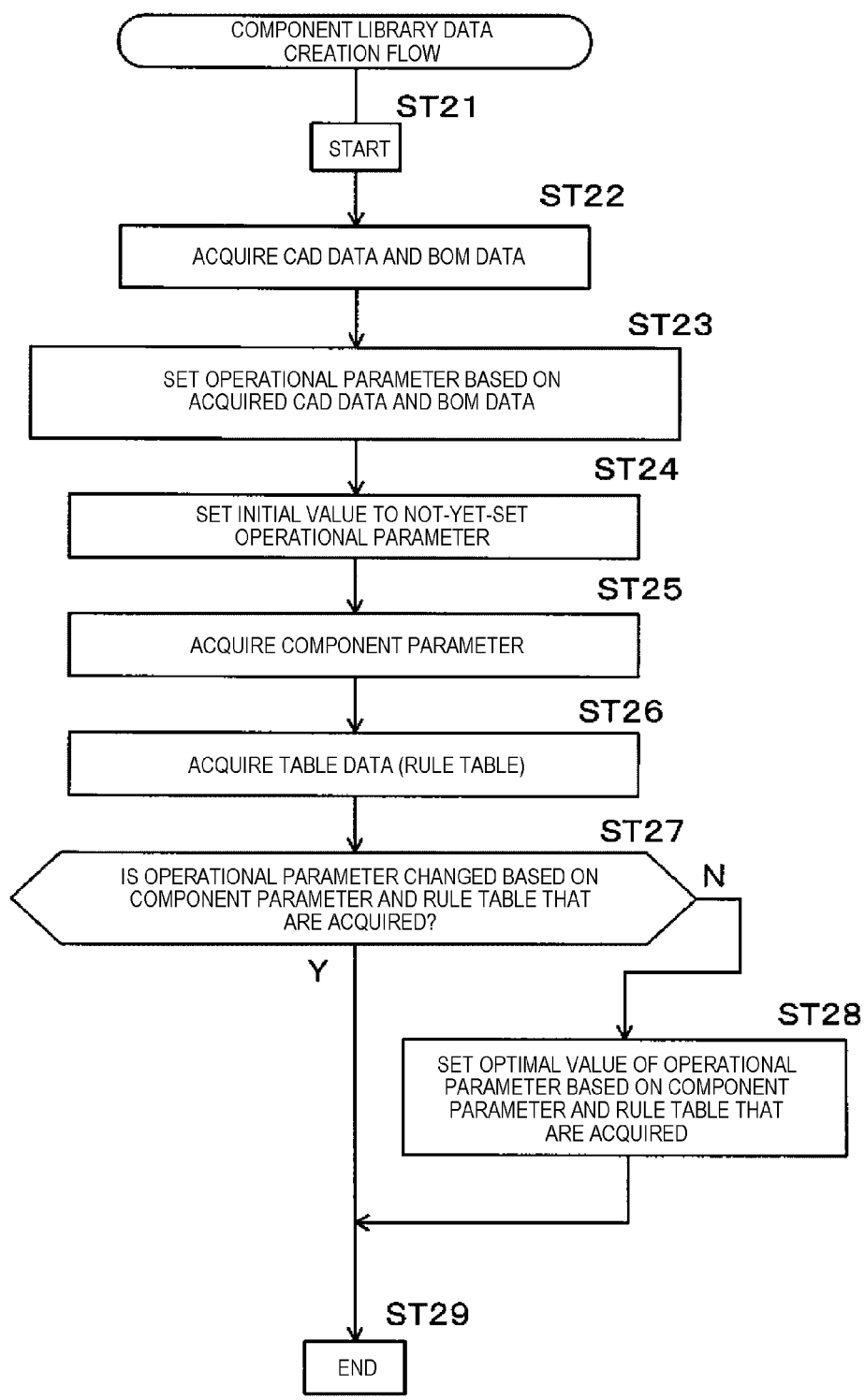
FIG. 10 is a flowchart of component library data creation that is based on an initial value in the component mounting system according to the exemplary embodiment.
Figure 11:
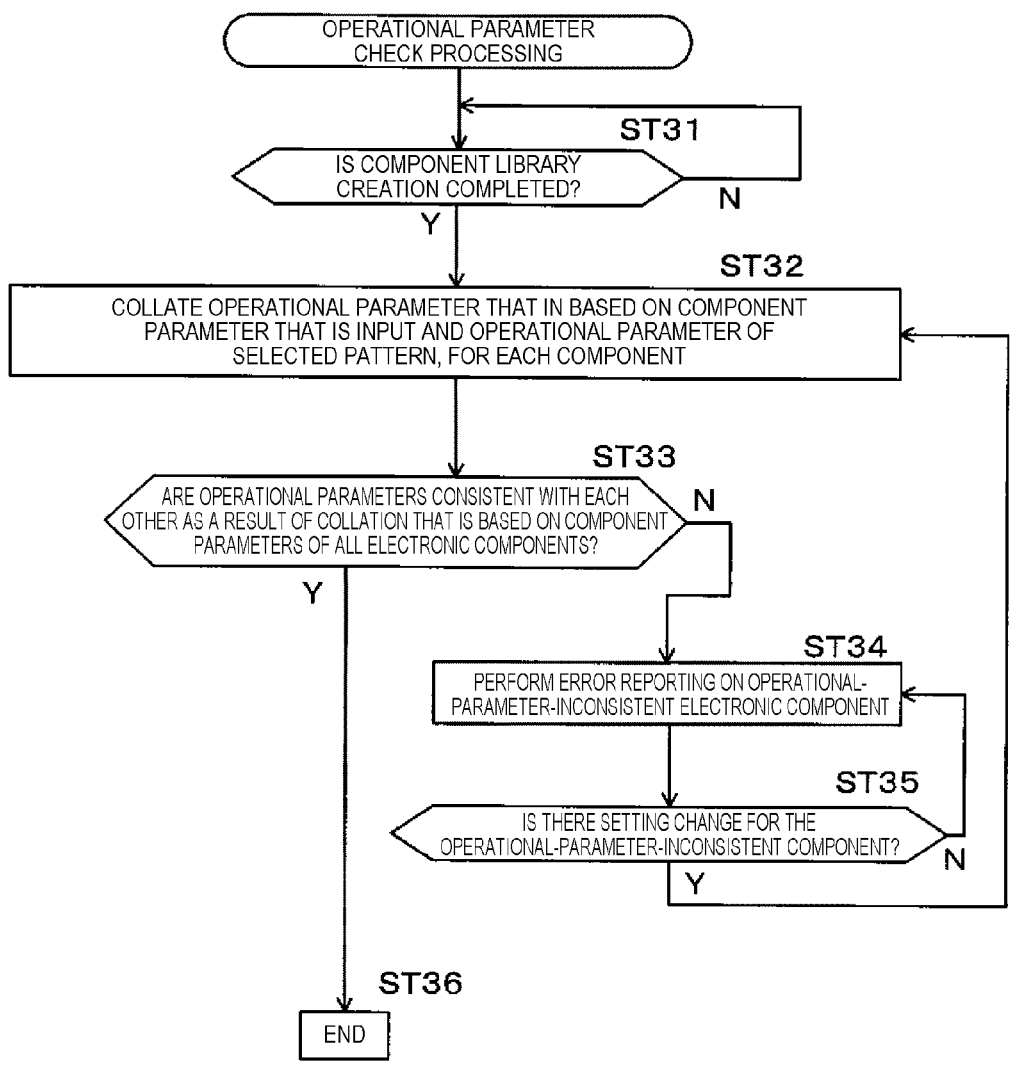
FIG. 11 is a flowchart of check processing of an operational parameter of the component library in the component mounting system according to the exemplary embodiment.

Next, check processing that checks whether or not the operational parameter that is set is correct in component library 32a that is created in accordance with the flow that is illustrated in FIG. 8 or 10 is described referring to FIG. 11. This checking processing is performed by collation units 40e that are included in controller 40 of component mounting apparatuses M4 and M5 which are arranged in component mounting line 4 in the production area.

When the processing starts, it is first determined whether or not the component library creation is completed (ST 31). If the completion of the creation is confirmed, the operational parameter that is based on the component parameter that is input and the operational parameter of the pattern that is selected are collated for each of the electronic components (ST 32). Subsequently, it is determined whether or not the operational parameters are consistent with each other as a result of the collation that is based on the component parameters of all electronic components (ST 33).

Figure 12:
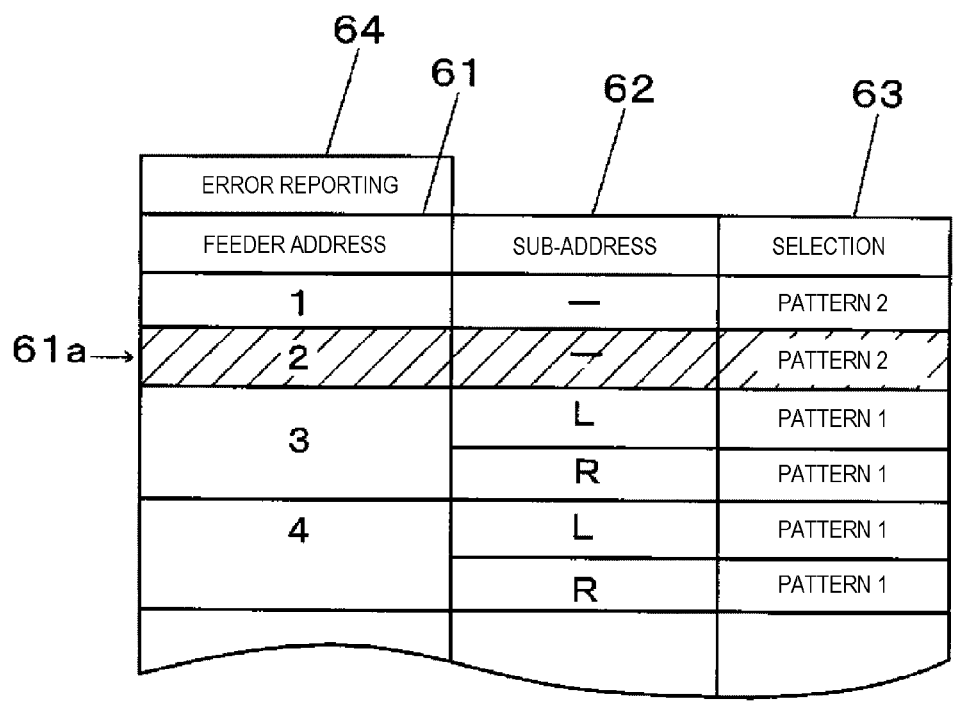
FIG. 12 is a diagram illustrating an error report that results from the check processing of the operational parameter of the component library in the component mounting system according to the exemplary embodiment.

At this point, in a case where the result of the collation is that the operational parameters are not consistent with each other, error reporting is performed on the operational-parameter-inconsistent electronic component (ST 34). FIG. 12 illustrates an error reporting screen that is displayed on display unit 40c at the time of the error reporting. That is, error report 64 that has the same configuration as the pattern selection screen which is illustrated in FIG. 8 is displayed on display unit 40c, and, among feeder addresses 61, specific address 61a that corresponds to an arrangement position of tape feeder 15 that accommodates the operational-parameter-inconsistent electronic component is reversely displayed on display unit 40c.

Next, it is determined whether or not there is a setting change as a result of making an amendment for the operational-parameter-inconsistent component (ST 35). At this point, in a case where an operational-parameter-inconsistent state continues without the setting change, returning to ST34 takes place and the error reporting is performed. Furthermore, in a case where the setting change is present in ST 35, that is, it is confirmed that an amendment change is made to a suitable setting value, returning to ST 32 takes place, and the same collation processing is performed repeatedly on a next electronic component. In ST 33, it is confirmed that the operational parameters are consistent with each other as the result of the collation that are based on the component parameters of all the electronic components, and the check processing ends (ST 36).

That is, in a case where the setting value of operational parameter 55 that is input and the setting value of operational parameter 55 that is set by setting unit 40d are not consistent with each other, collation unit 40e reports an error to display unit 40c. In the check processing, the setting value of operational parameter 55 that is set by setting unit 40d at the time of the error reporting is set to be displayed on display unit 40c.

Figure 13:
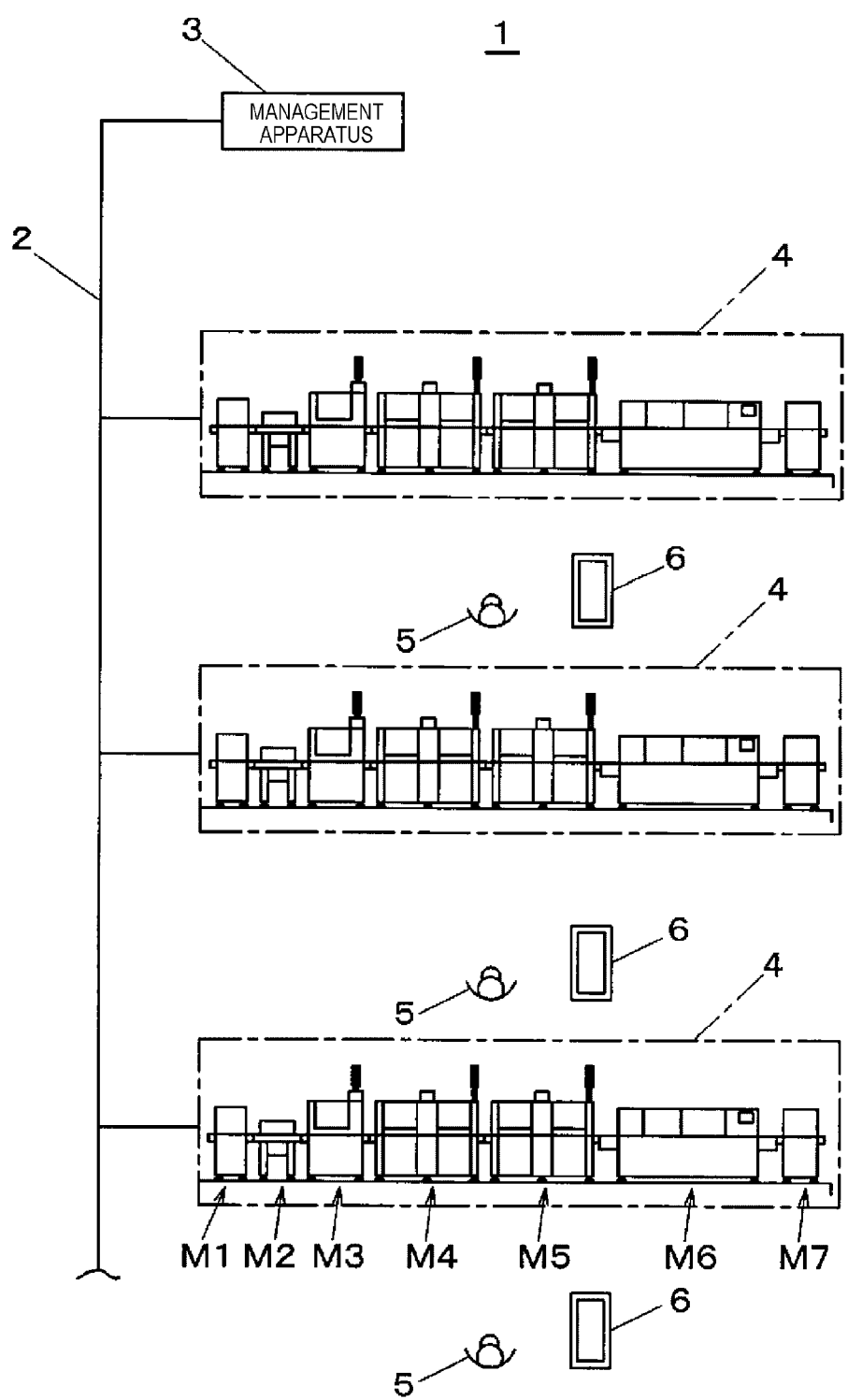
FIG. 13 is an explanatory diagram of a configuration of a component mounting system according to the exemplary embodiment.
Figure 14A:
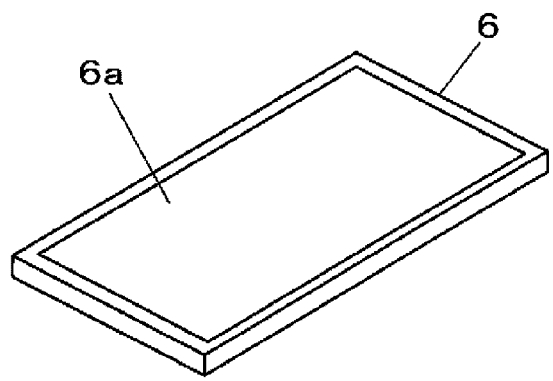
FIGS. 14A and 14B are block diagrams illustrating a configuration of a control system of a portable terminal that is used in the component mounting system according to the exemplary embodiment.
Figure 14B:
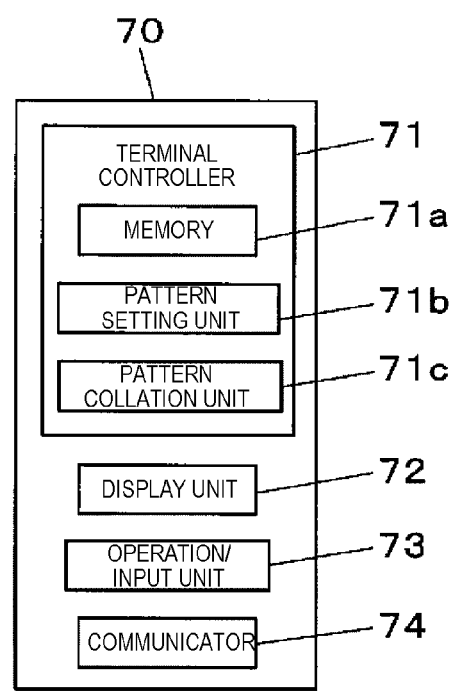

Next, a second aspect of the present exemplary embodiment is described referring to FIGS. 13, 14A, and 14B. According to the second aspect, as illustrated in FIG. 13, operators 5 who are assigned to component mounting lines 4 have portable terminals 6, respectively. It is possible to various operations for operating the apparatus through portable terminal 6. At this point, various operations for setting operational parameter 55 described above are performed through portable terminal 6.

As illustrated in FIGS. 14A and 14B, portable terminal 6 includes display panel 6a in which display of predetermined details on a screen or a touch operation for input is possible. The screen for the pattern selection that is illustrated in FIG. 7 or the screen for the error reporting that is illustrated in FIG. 12 is displayed on display panel 6a. Control unit 70 that is provided to portable terminal 6 includes terminal controller 71, display unit 72, operation/input unit 73, and communicator 74.

Terminal controller 71 is a processing device that is equipped with an arithmetic operation function, and includes memory 71a, pattern setting unit 71b, and pattern collation unit 71c. Display unit 72 performs processing that displays a predetermined screen on display panel 6a. Operation/input unit 73 performs processing for input of an operator command or data by a touch operation into display panel 6a. Communicator 74 is an interface that is equipped with a wireless communication function, and connects portable terminal 6 to communication network 2 in a wireless manner. Accordingly, transmission and reception of data between portable terminal 6 and other equipment such as component mounting apparatuses M4 and M5.

Data that is downloaded from the other equipment such as storages 41 of component mounting apparatuses M4 and M5 are written to memory 71a. Pattern setting unit 71b performs processing for setting the operational parameter by the pattern selection. That is, first, the pattern selection screen that is illustrated in FIG. 7 is first displayed on display panel 6a by a display function of display unit 72. The operator performs pattern selection input (refer to selection box 63 that is illustrated in FIG. 7) on the pattern selection screen that is displayed, and thus suitable operational parameter 55 that corresponds to selected pattern number 28 is set.

Pattern collation unit 71c has a function that is equivalent to collation units 40e in component mounting apparatuses M4 and M5, and performs the check processing of the operational parameter that is illustrated in FIG. 11 by collating selected pattern number 28. A result of the checking is displayed by causing display unit 72 to display the error reporting screen that is illustrated in FIG. 0.12, on display panel 6a.

As described above, in setting the setting value of operational parameter 55 in the component mounting apparatus according to the present exemplary embodiment, the setting value of component parameter 52 that includes at least one of component information 53 relating to the electronic component and tape information 54 relating to carrier tape 23 that is supplied by tape feeder 15 is input, rule table 33b in which component parameter 52 and the setting value of operational parameter 55 relating to the operation by at least one of the component mounting apparatuses are associated with each other is stored, and the setting value of operational parameter 55 that is linked to the setting value of component parameter 52 which is input is made to be set based on rule table 33b. Accordingly, a load of data amendment to component library 32a that is necessary in the production area is reduced, and the setting value of operational parameter 55 is set based on rule table 33b. Because of this, inconsistency between results of the setting by every operator is excluded, and thus reliability of the component library can be improved.

Furthermore, in a configuration in which tape feeder 15 is arranged in component supply unit 14, a configuration is employed in such a manner that rule table 33b in which the setting value of component parameter 52 and the setting value of operational parameter 55 are associated with each other and a pattern that specifies rule table 33b are stored in tape feeder 15, that the pattern of stored rule table 33b is displayed and the change operation input for changing the pattern of the displayed rule table is performed, and that the signal for changing the pattern of stored rule table 33b is output based on the change operation input. Accordingly, the operator can perform the operation for setting operational parameter 55 on individual tape feeder 15 as a target, and improvement in workability in the production area is possible.

Furthermore, the operational parameter setting support system according to the present exemplary embodiment is configured to include input unit 36 into which the setting value of component parameter 52 and the setting value of operational parameter 55 relating to the operation of at least one of the component mounting apparatuses, which is linked to component parameter 52 are input, storage 31 in which correlation table 33a in which component parameter 52 and operational parameter 55 that is linked to component parameter 52 are associated with each other is stored, and rule table creation processor 30a that creates rule table 33b from the setting value of component parameter 52 and the setting value of operational parameter 55 that are input into input unit 36 and from correlation table 33a that is stored in storage 31. Accordingly, rule table 33b that is used for the setting of operational parameter 55 can be easily created.

According to the exemplary embodiment described above, the correlation table and the rule table are created with one component parameter, but correlation table 33a and rule table 33b may be created with multiple component parameters and multiple operational parameters. FIG. 15A is an explanatory diagram of a configuration of a correlation table in a component library that is used in a component mounting system according to a different exemplary embodiment of the present invention. FIG. 15B is an explanatory diagram of a configuration of a rule table in the component library that is used in the component mounting system according to the different exemplary embodiment of the present invention. At this point, a case where price information 53a and carrier tape color information 53b are used as component parameters 52, according to the different exemplary embodiment of the present invention is described.

First, price information 53a and carrier tape color information 53b are set as component parameters 52, and for operational parameter 55, parameters that is linked to price information 53a and carrier tape color information 53b are set. At this point, "the number of times that a suction operation is re-performed" 57a, "the number of times that a component recognition operation is re-performed" 57b, "operation setting for re-performing a suction operation" 57c, "operation setting for re-performing a component recognition operation" 57d, "feeding operation setting of a joint portion that joins carrier tapes" 57e, "suction position automatic teaching use setting" 57f, and "suction position automatic teaching performing timing setting" 57g are set as operational parameters 55. Correlation table 33a is created by setting component parameter 52 and operational parameter 55.

Subsequently, with combinations of two setting values, that is, low price and high price that are setting values of price information 53a, and white, block, and transparency that are setting values of carrier tape color information 53b, 6 types of patterns (pattern numbers 1 to 6) are set. The setting value of operational parameter 55 is input for each of the 6 pattern numbers that are set. The setting value of operational parameter 55 is set with manual input by the operator or by inputting an input value that is determined in advance. Thus, individual rule table 33b\* that corresponds to each of pattern numbers is created (also refer to the examples that are in FIGS. 6A and 6B).

At this point, a fact that, whereas individual rule table 33b\* described above corresponds to 6 pattern numbers, the number of pattern numbers of individual rule tables 33b\* for component parameter 52 is 3 in FIG. 15B is described. In each pattern of individual rule table 33b\* that is created as described above, the setting values of operational parameter 55 are compared, and patterns in which all setting values of operational parameter 55 are consistent merged. Setting items for component parameter 52 for the patterns that are merged, and individual rule table 33b\* is created.

Because of this, among patterns that are illustrated with pattern number 58 in FIG. 15B, for a carrier tape color setting item for component parameter 52, multiple items are set with pattern numbers 1 and 3. The merging is performed in this manner, and thus the number of patterns is decreased. As a result, the number of patterns that is set by the operator can be decreased and the workability can be improved. According to the different exemplary embodiment of the present invention, pattern data 33c that is defined in rule table 33b and rule table 33b that are created are used and the creation of the component library or the initial value setting processing are performed in the same manner as in the example described above.

The descriptions are provided above based on one embodiment of the present invention. It is apparent to a person of ordinary skill in the art that various examples of modification to combinations of the constituent elements or of processing processes according to the exemplary embodiments are possible and that these modification examples also fall within the scope of the present invention.

For example, according to the exemplary embodiments described above, the price information is described as information indicating which of low price and high price the electronic component belongs to in light of a price determination reference that is set in advance. However, as the price determination reference, a simple determination reference may be employed in such a manner that if a unit price of the electronic component is equal to or more than 1,000 Yen, the electronic component is at a high price and that if the unit price of the electronic component is less than 1,000 Yen, the electronic component is a low price. Furthermore, although the electronic components are the same, because the prices are different depending on the time of purchasing, a price determination reference that is based on the actual purchasing price may be used. For example, a rank of purchasing prices for a predetermined period of time is calculated based on purchasing data that is acquired from an MRP software application that is used in the production facility, and a price determination reference may be employed in such a manner that the purchasing prices that are ranked from the highest level to a predetermined level as a result of the calculation of the rank or the purchasing prices that fall within a predetermined percentage range are high and that, otherwise, the purchases prices are low.

Furthermore, in a case where the price information is included in the BOM data, the low price and the high price may be determined based on the price information that is included in the BOM data. More specifically, a unit price of the electronic component is calculated from the purchasing price of the electronic component that is included in the BOM data and from the total number of the electronic components, and the low price and the high price may be determined in light of the price determination reference. By setting the price information based on the BOM data, operator performance can be improved without the need to set the price information for each of the electronic components.

Furthermore, according to the exemplary embodiments described above, as one example, the tape feeder that requires a splicing operation is described, but the present invention is also applied to a tape feeder that does not require the splicing operation (this tape feeder is hereinafter referred to as an auto load feeder). In a case of the auto load feeder, because the joint portion that joins together the carrier tapes is not necessary, an operational parameter for setting other than feeding operation setting of the joint portion that joins together the carrier tapes, carrier tape feeding speed setting, carrier in-advance feeding setting is made to be set.

As described above, a component mounting apparatus M4 (M5) is configured to transfer an electronic component P from a component supply unit 14 including a tape feeder 15 supplying a carrier tape 23 holding the electronic component P, and to transfer the electronic component P to a substrate 13 for mounting the electronic component P to the substrate 13. The component mounting apparatus M4 (M5) includes an input unit 36 into which a setting value of a component parameter 52 is input, a storage 31 configured to store a rule table 33b, and a setting unit 40d. The component parameter 52 includes at least one of component information 53 relating to the electronic component P and tape information 54 relating to the carrier tape 23. The rule table 33b links each of one or more setting values of the component parameter 52 to respective one of one or more setting values of an operational parameter 55 relating to at least one operation of the component mounting apparatus M4 (M5). The setting unit 40d sets, based on the rule table 33b, a setting value of the operational parameter 55 which is linked to the setting value of the component parameter 52 input into the input unit 36.

The component mounting apparatus M4 (M5) may further includes a mounting head 19 including a suction nozzle 20 configure to transfer the electronic component P from the carrier tape 23. The component information 53 may be price information 53a of the electronic component P. The carrier tape 23 may include a joint portion J that joints the carrier tape 23 to another carrier tape 23B. In this case, the operational parameter 55 includes a value of at least one of the number 57a (57b) of times that a component suction operation by the suction nozzle 20 or a recognition operation of the electronic component P is re-performed, an operation setting 57c for re-performing the component suction operation by the suction nozzle 20 or the recognition operation, and a feeding operation setting 57e related to an operation when the joint portion J is fed.

The tape information 54 may include at least one of a tape width 54a of the carrier tape 23, a feeding interval 54b of the carrier tape 23, and color or material information 54c of the carrier tape 23. The carrier tape 23 may include a pocket 23b accommodating the electronic component P therein and a cover tape 23c that covers the pocket 23b. In this case, the operational parameter 55 includes a value of at least one of an automatic teaching use setting 57f that stipulates presence or absence of performing of automatic teaching that automatically sets a position of suction of the electronic component P by the suction nozzle 20, using image recognition, a timing setting 57g that sets a timing at which the automatic teaching is performed, a feeding speed setting that sets a feeding speed of the carrier tape 23, and a carrier tape in-advance feeding setting that, in advance, feeds, to a component transferring position, the pocket 23b from which the electronic component P is exposed after the cover tape 23c is removed from the carrier tape 23.

The setting unit 40d may set, based on the rule table 33b, a setting value of the component parameter 52 out of the one or more setting values of the component parameter 52 which is set most frequently and a setting value of the operational parameter 55 out of the one or more setting values of the operational parameter 55 which is linked to the setting value of the component parameter 52 which is set most frequently as an initial value of the component parameter 52 and an initial value of the operational parameter 55, respectively.

A setting support system is configures to set an operational parameter 55 that stipulates an operation of a component mounting apparatus M4 (M5). The component mounting apparatus M4 (M5) is configured to transfer an electronic component P from a component supply unit 14 including a tape feeder 15 that supplies a carrier tape 23 holding the electronic component P and to transfer the electronic component P to a substrate 13 for mounting the electronic component P to the substrate 13. The setting support system includes an input unit 36, a storage 31 configured to store a correlation table 33a, and a creation processor 30a. Into the input unit 36, a setting value of a component parameter 52 that includes at least one of component information 53 relating to the electronic component P and tape information 54 relating to the carrier tape 23, and a setting value of an operational parameter 55 relating to an operation by the component mounting apparatus M4 (M5), which is linked to the component parameter 52, are input. The correlation table 33a links the component parameter 52 to the operational parameter 55. The creation processor 30a creates a rule table 33b from the setting value of the component parameter 52 and the setting value of the operational parameter 55 which are into to the input unit 36, and from the correlation table 33a that is stored in the storage 31.

The component parameter 52 may be a parameter that has no direct relationship to the operation by the component mounting apparatus M4 (M5).

The setting support system may further include a setting unit 40d that sets the setting value of the operational parameter 55 which is linked to the setting value of the component parameter 52 that is input into the input unit 36, and a display unit 37 that displays the operational parameter 55. In this case, the setting unit 40d sets the setting value of the operational parameter 55 that is linked to the component parameter 52, based on the component parameter 52 that is input into the input unit 36 and the created rule table 33b. The display unit 37 displays the setting value of the operational parameter 55 that is set by the setting unit 40d.

The rule table 33b may include one or more individual rule tables 33b*. Each of the one or more individual rule tables 33b* links respective one of one or more setting values of the component parameter 52 to respective one of one or more setting values of the operational parameter 55. In this case, the storage 31 stores the one or more individual rule table 33b* and one or more patterns 58a and 58b each specifying respective one of the one or more individual rule tables 33b*. The display unit 37 displays a pattern 58a out of the one or more patterns 58a and 58b which specifies an individual rule table 33b* out of the one or more individual rule tables 33b* which is set by the setting unit 40d.

The setting support system may further include a collation unit 40e that collates the input setting value of the operational parameter 55 to the setting value of the operational parameter 55 that is set by the setting unit 40d. In this case where the input setting value of the operational parameter 55 is inconsistent with the setting value of the operational parameter 55 that is set by the setting unit 40d, the collation unit 40e allows the display unit 37 to display an error report.

The display unit 37 may display, as the error report, the setting value of the operational parameter 55 that is set by the setting unit 40d.

The component mounting apparatus and the method of setting the setting value of the operational parameter according to the exemplary embodiments have an effect in which the load of the data amendment to the component library is reduced and the reliability of the component library can be improved, and are useful in a component mounting field where an electronic component is mounted on a substrate.

What is claimed is:

1. A setting support system for setting an operational parameter that stipulates an operation of mounting an electronic component onto a substrate by a component mounting apparatus, wherein the component mounting apparatus is configured to unload the electronic component from a component supply unit including a tape feeder that supplies a carrier tape holding the electronic component and to transfer the electronic component to the substrate for mounting the electronic component to the substrate, the setting support system comprising:
   a controller of the component mounting apparatus that includes an input unit into which a setting value of a component parameter that includes at least one of component information relating to the electronic component and tape information relating to the carrier tape, and a setting value of an operational parameter relating to the operation of mounting the electronic component onto the substrate by the component mounting apparatus, which is linked to the component parameter, are input;
   a storage configured to store a correlation table linking the component parameter to the operational parameter; and
   a creation processor that creates a rule table from the setting value of the component parameter and the setting value of the operational parameter which are input into the input unit, and from the correlation table that is stored in the storage,
   wherein the component mounting apparatus is configured to perform the operation of mounting an electronic component onto a substrate by the component mounting apparatus based on the rule table created by the creation processor,
   wherein the component mounting apparatus further includes a mounting head including a suction nozzle configure to unload the electronic component from the carrier tape,
   wherein the component information is price information of the electronic component,
   wherein the carrier tape includes a joint portion that joins the carrier tape to another carrier tape, and
   wherein the operational parameter includes a value of at least one of the number of times that a suction operation by the suction nozzle or a recognition operation of the electronic component is re-performed, an operation setting for re-performing the suction operation by the suction nozzle or the recognition operation, and a feeding operation setting which relates to an operation when the joint portion is fed.

2. The setting support system of claim 1,
wherein the component parameter is a parameter that has no direct relationship to the operation of mounting an electronic component onto a substrate by the component mounting apparatus.

3. The setting support system of claim 1, further comprising:
the controller of the component mounting apparatus includes a setting unit that sets the setting value of the operational parameter which is linked to the setting value of the component parameter that is input into the input unit; and
a display unit that displays the operational parameter,
wherein the setting unit sets the setting value of the operational parameter that is linked to the component parameter, based on the component parameter that is input into the input unit and the created rule table, and
wherein the display unit displays the setting value of the operational parameter that is set by the setting unit.

4. The setting support system of claim 1,
wherein the tape information includes at least one among a tape width of the carrier tape, a feeding interval of the carrier tape, and color or material information related to characteristics in image recognition of the carrier tape,
wherein the component mounting apparatus includes a mounting head including a suction nozzle configure to unload the electronic component from the carrier tape,
wherein the carrier tape includes a pocket accommodating the electronic component therein and a cover tape that covers the pocket, and
wherein the operational parameter includes a value of at least one of automatic teaching use setting that stipulates presence or absence of performing of automatic teaching that automatically sets a position of suction of the electronic component by the suction nozzle, using image recognition, an automatic teaching performing timing setting that sets a timing at which the automatic teaching is performed, a feeding speed setting that sets a feeding speed of the carrier tape, and a carrier tape in-advance feeding setting that, in advance, feeds, to a component unloading position, the pocket after the cover tape is removed from the carrier tape.

5. The setting support system of claim 3,
wherein the rule table links each of one or more setting values of the component parameter to respective one of one or more setting values of the operational parameter, and
wherein the setting unit of the controller sets, based on the rule table, a setting value out of the one or more setting values of the component parameter which is set most frequently, and a setting value out of the one or more setting values of the operational parameter as an initial value of the component parameter and an initial value of the operational parameter, respectively.

6. The setting support system of claim 3,
wherein the rule table includes one or more individual rule tables, and each of the one or more individual rule tables links respective one of one or more setting values of the component parameter to respective one of one or more setting values of the operational parameter,
wherein the storage stores the one or more individual rule tables and the plurality of patterns each specifying respective one of the one or more individual rule tables, and
wherein the display unit displays a pattern out of the plurality of patterns which specifies an individual rule table out of the one or more individual rule tables which is set by the setting unit of the controller.

7. The setting support system of claim 3, further comprising:
a collation unit that collates the input setting value of the operational parameter to the setting value of the operational parameter that is set by the setting unit of the controller,
wherein, in a case where the input setting value of the operational parameter is inconsistent with the setting value of the operational parameter that is set by the setting unit of the controller, the collation unit of the controller allows the display unit to display an error report.

8. The setting support system of claim 3,
wherein the display unit displays, as an error report, the setting value of the operational parameter that is set by the setting unit of the controller.

9. The setting support system of claim 1,
wherein the tape information includes tape material of the carrier tape, tape width indicating dimension of the carrier tape, feeding interval indicating a tape feeding pitch, and color of the carrier tape.

10. The setting support system of claim 1, wherein the component information is information regarding polarity of the electronic component, a polarity mark, a mark position, a component type, and price.

* * * * *